United States Patent
Bendall et al.

(10) Patent No.: US 6,472,870 B1
(45) Date of Patent: Oct. 29, 2002

(54) RADIOFREQUENCY IRRADIATION SCHEMES AND METHODS OF DESIGN AND DISPLAY FOR USE IN PERFORMING NUCLEAR MAGNETIC RESONANCE SPECTROSCOPY

(76) Inventors: M. Robin Bendall, Biochemistry Department University of Melbourne, Parkville VIC 3052 (AU); Thomas E. Skinner, 3986 Cozycroft, Dayton, OH (US) 45424

(*) Notice: Subject to any disclaimer, the term of this patent is extended or adjusted under 35 U.S.C. 154(b) by 0 days.

(21) Appl. No.: 09/514,344

(22) Filed: Feb. 28, 2000

Related U.S. Application Data

(60) Provisional application No. 60/121,231, filed on Feb. 23, 1999, and provisional application No. 60/165,759, filed on Nov. 16, 1999.

(51) Int. Cl.[7] ............................................. G01V 3/00
(52) U.S. Cl. ............................................. 324/307; 324/314
(58) Field of Search ........................... 324/314, 300, 324/306, 307, 309, 312

(56) References Cited

U.S. PATENT DOCUMENTS

| | | | |
|---|---|---|---|
| 4,742,303 A | 5/1988 | Bendall | |
| 5,274,329 A | * 12/1993 | Knuttel et al. | 324/300 |
| 6,133,736 A | * 10/2000 | Pervushin et al. | 324/307 |
| 6,184,683 B1 | * 2/2001 | Emsley et al. | 324/307 |

OTHER PUBLICATIONS

Sorensen et al., *Progress in NMR Spectroscopy*, 16, 163–192 (1983).
Levitt et al., *Journal of Magnetic Resonance*, 53, 443–461 (1983).
Anderson & Freeman, *Journal of Chemical Physics*, 37, 85–103 (1962).
Waugh, *Journal of Magnetic Resonance*, 49, 517–521 (1982).
Shake & Keller, *Progress in NMR Spectroscopy*, 19, 47–129 (1987).
Sanctuary, *Journal of Chemical Physics*, 64, 4352–4361 (1976).
Nakashima & McClung, *Journal of Magnetic Resonance*, 70, 187–203 (1986).
Bain, *Progress in NMR Spectroscopy*, 20, 295–315 (1988).
Bendall & Pegg, *Magnetic Resonance in Medicine*, 2, 91–113 (1985).

(List continued on next page.)

*Primary Examiner*—Louis Arana

(57) ABSTRACT

For an NMR (nuclear magnetic resonance) experiment exact quantum-mechanical solutions have been obtained for the effect of RF (radiofrequency) pulses of constant amplitude, phase, and frequency, on any initial configuration of an $I_m S_n$ J-coupled system. Subsets of these equations (rotation matrices) can be used to calculate the exact result of shaped RF pulses (modulated amplitude and phase). The rotation matrices remain valid when no RF is applied, so the result of a pulse sequence can be calculated continuosly throughout an NMR pulse sequence, yielding a method useful for specifying steps throughout sequences, the design of new sequences, or the display or debugging of sequences. During continuous wave (CW) decoupling applied to the I spins, the S-spin signal yields sidebands whose frequency depends on RF field strength and homogeneity, and these sidebands are further enhanced starting with antiparallel spinstates instead of in-phase magnetization. A family of Characterization of Decoupler (COD) pulse sequences are described which utilize these phenomena to evaluate the performance (RF frequency, amplitude and homogeneity) of the insensitive I-spin channel of a spectrometer by observing large signals with the sensitive S-spin channel. Frequency selective spin-state transformations are also described which can take the place of any combination of a hard 90° pulse and a consecutive $(2J)^{-1}$ delay period in any pulse sequence.

22 Claims, 13 Drawing Sheets

OTHER PUBLICATIONS

Bendall & Pegg, *Journal of Magnetic Resonance*, 63, 494–503 (1985).

Bendall & Pegg, *Journal of Magnetic Resonance*, 66, 546–550 (1986).

Bazzo & Boyd, *Journal of Magnetic Resonance*, 79, 568–576 (1988).

Chalmers et al., *Journal of Magnetic Resonance*, 15, 415–419 (1974).

Jakobsen et al., *Journal of Magnetic Resonance*, 54, 134–141 (1983).

Bildsoe, *Journal of Magnetic Resonance*, 27, 393–404 (1977).

Brondeau & Canet, *Journal of Magnetic Resonance*, 47, 419–400 (1982).

Bendall et al., *Journal of Magnetic Resonance*, 44, 238–249 (1981).

Bendall et al., *Journal of Magnetic Resonance*, 45, 8–29 (1981).

Bendall, *Journal of Magnetic Resonance*, A 116, 46–58 (1995).

Skinner & Bendall, *Journal of Magnetic Resonance*, 134, 315–330 (1998).

Bendall et al., *Journal of Magnetic Resonance*, 46, 43–53 (1982).

Bendall et al., *Journal of Magnetic Resonance*, 52, 81–117 (1983).

Shriver, *Journal of Magnetic Resonance*, 94, 612–616 (1991).

Kanters et al., *Journal of Magnetic Resonance*, A 101, 23–29 (1993).

Ernst, *Journal of Chemical Physics*, 45, 3845–3861 (1966).

Pachler, *Journal of Magnetic Resonance*, 7, 442–443 (1972).

Bendall & Gordon, *Journal of Magnetic Resonance*, 53, 365–385 (1983).

Bendall & Pegg, *Journal of Magnetic Resonance*, 57, 337–343 (1984).

Bendall & Pegg, *Magnetic Resonance in Medicine*, 2, 298–306 (1985).

Talagala & Gillen, *Journal of Magnetic Resonance*, 94, 493–500 (1991).

Morris & Freeman, *Journal of the American Chemical Society*, 101, 760–762 (1979).

\* cited by examiner

FIG. 4
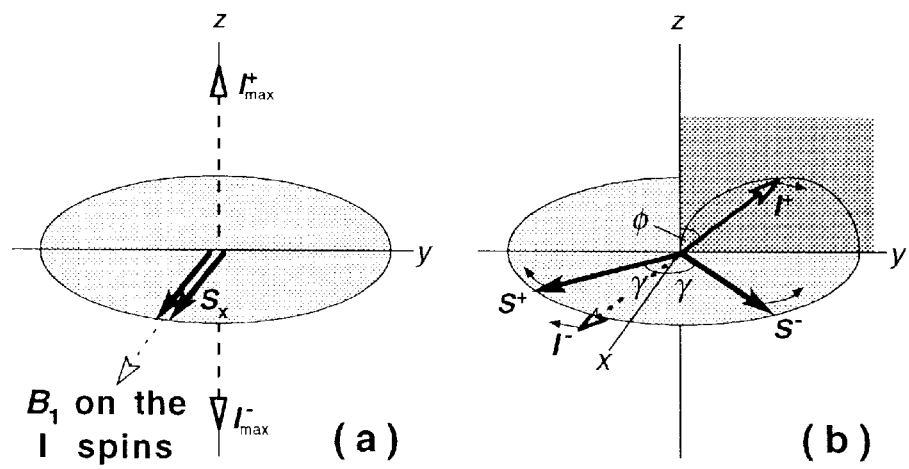
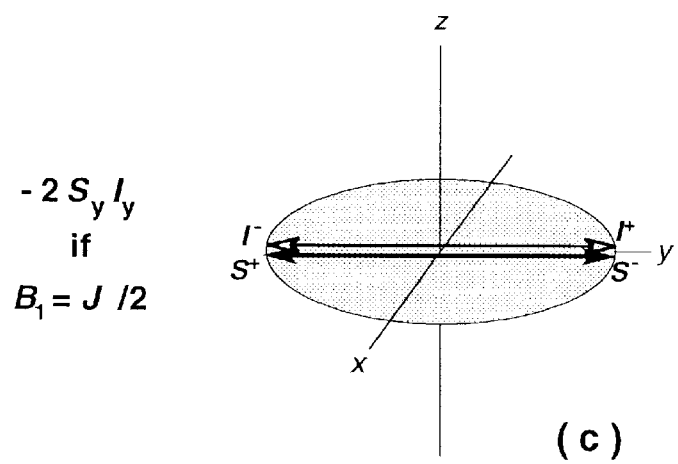
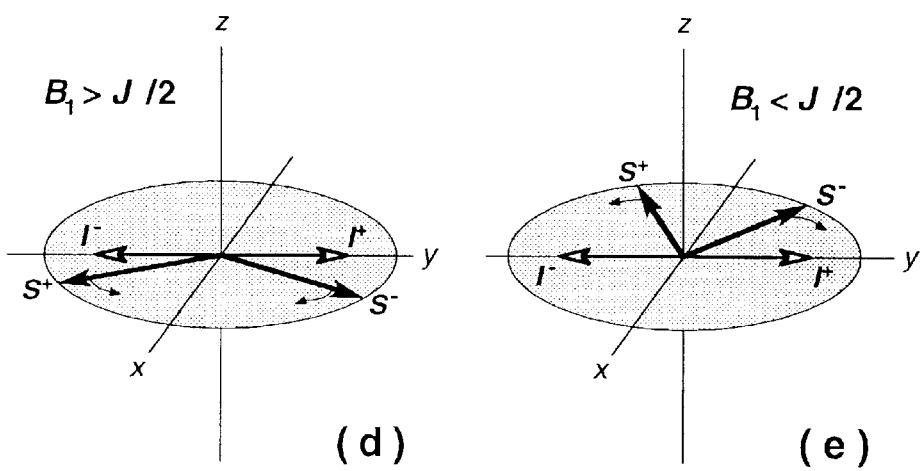

FIG. 6

BEFORE

| AFTER | $I_z$ | $I_y$ | $2S_xI_x$ | $2S_yI_x$ | $2S_zI_x$ | $I_x$ | $2S_xI_y$ | $2S_yI_y$ | $2S_zI_y$ | $S_x$ | $S_y$ | $S_z$ | $2S_xI_z$ | $2S_yI_z$ | $2S_zI_z$ |
|---|---|---|---|---|---|---|---|---|---|---|---|---|---|---|---|
| $I_z$ | 1 | 0 | 0 | 0 | 0 | 0 | 0 | | | | | | | | |
| $I_y$ | 0 | + | + | + | + | 0 | 0 | 0 | | | | | | | |
| $2S_xI_x$ | 0 | + | + | + | + | 0 | 0 | 0 | 0 | | | | | | |
| $2S_yI_x$ | 0 | + | + | + | + | 0 | 0 | 0 | 0 | 0 | | | | | |
| $2S_zI_x$ | 0 | + | + | + | + | 0 | 0 | 0 | 0 | 0 | 0 | | | | |
| $I_x$ | 0 | 0 | 0 | 0 | 0 | + | + | + | + | 0 | 0 | 0 | | | |
| $2S_xI_y$ | 0 | 0 | 0 | 0 | 0 | + | + | + | + | 0 | 0 | 0 | 0 | | |
| $2S_yI_y$ | | 0 | 0 | 0 | 0 | + | + | + | + | 0 | 0 | 0 | 0 | 0 | |
| $2S_zI_y$ | | | 0 | 0 | 0 | + | + | + | + | 0 | 0 | 0 | 0 | 0 | 0 |
| $S_x$ | | | | 0 | 0 | 0 | 0 | 0 | 0 | + | + | + | + | + | + |
| $S_y$ | | | | | 0 | 0 | 0 | 0 | 0 | + | + | + | + | + | + |
| $S_z$ | | | | | | 0 | 0 | 0 | 0 | + | + | + | + | + | + |
| $2S_xI_z$ | | | | | | | 0 | 0 | 0 | + | + | + | + | + | + |
| $2S_yI_z$ | | | | | | | | 0 | 0 | + | + | + | + | + | + |
| $2S_zI_z$ | | | | | | | | | 0 | + | + | + | + | + | + |

⟵———— nonclassical ————⟶ ⟵———— classical ————⟶

One time increment of RF irradiation on the S spins

RADIOFREQUENCY IRRADIATION SCHEMES AND METHODS OF DESIGN AND DISPLAY FOR USE IN PERFORMING NUCLEAR MAGNETIC RESONANCE SPECTROSCOPY

CROSS REFERENCES

Benefit is claimed under 35 U.S.C. 119(e) for the following United States provisional applications:

| Application numbers | Filing dates |
| --- | --- |
| 60/121,231 | 02/23/99 |
| 60/165,759 | 11/16/99 |

BACKGROUND OF THE INVENTION

The context of the present work can best be described as a conventional NMR system. Such a conventional system is described in U.S. Pat. No. 4,742,303 incorporated herein by reference. The invention concerns the use of coupling modulation, manifested by a system of (two or more) spin-half nuclear spins I and S (i.e., an IS spin-half system), during RF (radiofrequency) irradiation of one of the spins, in various types of NMR (nuclear magnetic resonance) experiments.

The terminology used in this disclosure is as commonly used in the NMR literature and examples may be found in the publications cited. The names of the IS spinstates are as used by Sorensen, Eich, Levitt, Bodenhausen and Ernst (Progress in NMR Spectroscopy, 16, 163 (1983)) for the product operator (PO) formalism. However, unlike Sorensen et al we group all the one-spin product operators, $S_i$ (i=x, y, or z), together and describe them as in-phase states or magnetization, and we describe all the two-spin product operators, $2S_iI_j$ (i=x, y, or z; j=x, y, or z) as antiparallel spinstates or antiparallel magnetization. A second difference, which will be expanded further in this disclosure, is that Sorensen et al describe spinstates as observable only if they provide detectable magnetization during signal acquisition. In this disclosure we are concerned with the actual measurable state of an IS system at any time during an RF pulse or sequence of pulses. We consider a state to be measurable if maximum detectable signal can be obtained after a hard on-resonance pulse on the S spins and/or a hard on-resonance pulse on the I spins. Thus the orthogonal PO states are convenient descriptors of the total state because the total state can be resolved into a linear combination of the PO states, and each PO state is measurable after a hard on-resonance 90° pulse on the S and/or I spins.

For an IS J-coupled system at the beginning of a 1D (one-dimensional) decoupled acquisition, it has been considered impossible to produce detectable signal from pure antiparallel spinstates, $2S_yI_j$ (j=x, y, or z), because it has been assumed that the antiparallel components self cancel (e.g. see Levitt, Bodenhausen and Ernst, Journal of Magnetic Resonance 53, 443 (1983)). However, we find that a decoupler field of constant amplitude and frequency, applied to the I spins while observing the S spins, establishes an additional channel for communication between I and S which produces, via J-mediated effects, a coupled time evolution yielding directly detectable in-phase transverse magnetization, $S_x$. This mechanism provides an initial basis for the embodiments of the invention. The S-spin signal produced whilst continuously irradiating the I spins may appear as sideband or centerband intensity depending on the initial antiparallel spinstates. Alternatively, discrete I-spin irradiation (RF pulses) may enable 100% transformation between different antiparallel and in-phase spinstates. An exact QM (quantum mechanical) analysis of this behaviour, generalized for all possible intial conditions, provides a means to calculate and design new selective RF pulses, and sequences of RF pulses. Several fast and efficient methods for characterizing the Insensitive I-spin channel of a spectrometer by observing the sideband signals with the Sensitive S-spin channel are described. These various methods of design and display comprise embodiments of the invention.

The detailed QM study of CW (continuous wave) decoupling of I spins in an IS spin system, by Anderson and Freeman (Journal of Chemical Physics 37, 85 (1962)), and other pioneering work noted by these authors, provided an analytical solution for the amplitude and frequency of the decoupled $S_x$ signal starting with pure in-phase magnetization, $S_x$, of the observed nucleus. However, the $S_x$ spinstate is just one of 15 possible IS product operator spinstates that can arise from irradiation of either the I or S spins. In general, any of the 15 PO spinstates can be produced beginning with any single PO spinstate so there are 15×15=225 analytical equations that completely describe an IS spin system subject to RF irradiation. The theoretical basis of the invention required the derivation of the other 224 equations, and all the embodiments of the invention for an IS spin system use the entire set or subsets of these 225 equations.

BRIEF DESCRIPTION OF THE INVENTION

In a first general embodiment of the invention, a method is obtained to allow the rapid calculation of and determination of the result of a complex series of RF pulses and time delays (a pulse sequence) and thus can be used to design RF pulse sequences or the equipment that delivers RF pulse sequences or to determine the exact result of a pulse sequence. For example, the invention can be used to display the mechanism of RF pulse sequences for each time increment throughout the sequence for the purposes of education, software/hardware debugging, or the discovery of new pulse sequences.

In a second specific embodiment of the invention, continuous RF irradiation generates sideband signals whose frequency depends on the amplitude of the irradiation and thus the power and homogeneity of the radiofrequency source. This information may be used to assess or improve the design of the NMR probe that produces and detects the radiofrequency energy.

In a third general embodiment of the invention, RF pulses of low power interconvert orthogonal PO (product operator) spinstates of the IS system. This interconversion is frequency selective and thus may be used to discriminate between spins in differing chemical environments that consequently resonate at different frequencies.

Whilst all the examples and illustrations of the invention presented in this specification are in the context of J (or scalar) coupling between the two types of nuclear spin, the theoretical basis of the invention is also valid for dipolar coupling, thus permitting the invention to be applied to two or more dipolar-coupled spins in solids or partially-aligned chemical systems.

For simplicity all the examples in this specification are in terms of two single spins I and S, but the invention also applies to multiple I and S spins as in an $I_mS_n$ spin system. Provided the RF irradiation is applied to only one type of spin at any one time, the invention is equally applicable to homonuclei or heteronuclei. In this context, the distinguishing feature of different types of homonuclei is that they must resonate at different NMR frequencies. Since the invention is applicable to RF irradiation of only one type of spin at any one time, the behaviour of more than two types of coupled spins can be determined by sequential application of the invention to each pair of spin types, I and S.

Although common aspects of NMR spectroscopy such as pulsed field gradients and nuclear spin relaxation do not form a part of the invention, such aspects may, nevertheless, be included within calculations of RF pulse sequences as expressed in the first general embodiment of the invention. The new art comprises a means of rapidly calculating the effect of RF pulses inclusive of coupling modulation, and thus a new fundamental means of analysing NMR experiments. Other common attributes such as gradients and relaxation can be added to this fundamental approach using conventional protocols.

BRIEF DESCRIPTION OF THE DRAWINGS

TABLE 1 lists expansion coefficients of the Pauli basis set

TABLE 2 translates these coefficients in terms of Cayley-Klein parameters.

TABLE 3 tabulates the product operator coefficients for $IS_n$ systems.

TABLE 4 lists the arguments of TABLE 3 in terms of the functions in TABLE 2.

TABLE 5 provides standard matrix results for an arbitrary classical rotation.

TABLE 6 lists combinations of classical rotations applicable to irradiation of the I spins.

Figure 1:
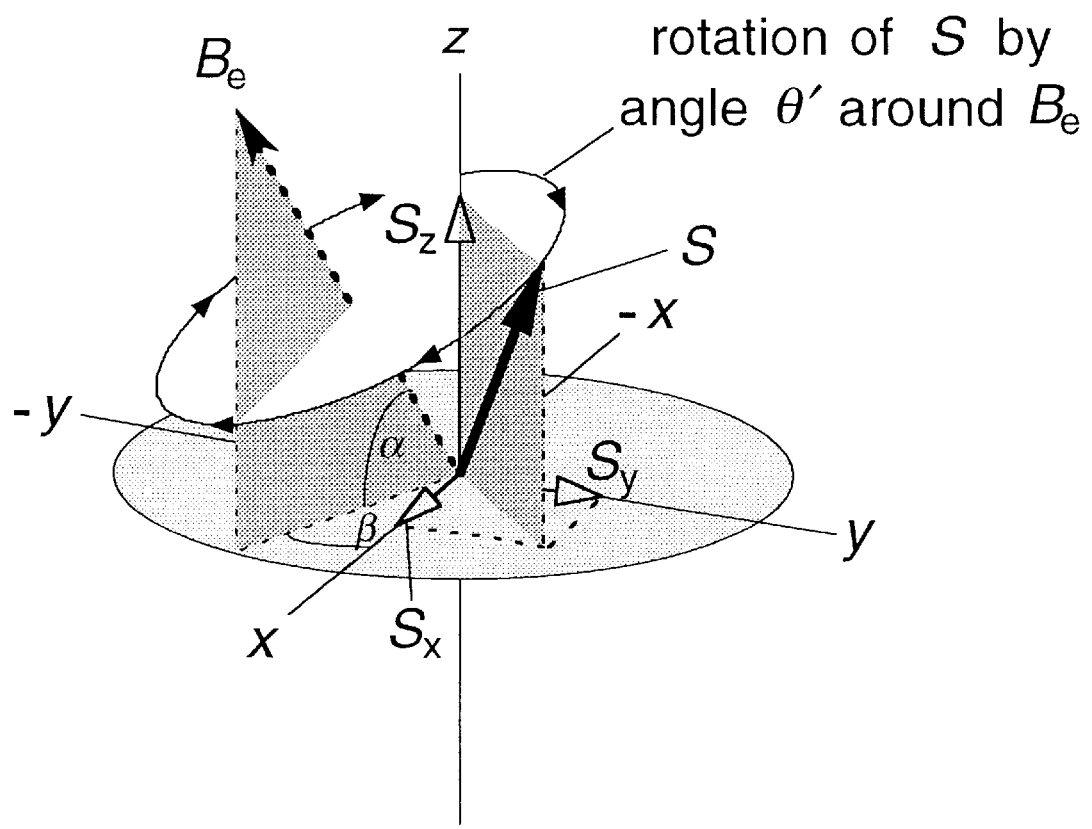

FIG. 1 shows the classical rotation of a magnetization vector of an S spin around an effective RF field $B_e$.

Figure 2:
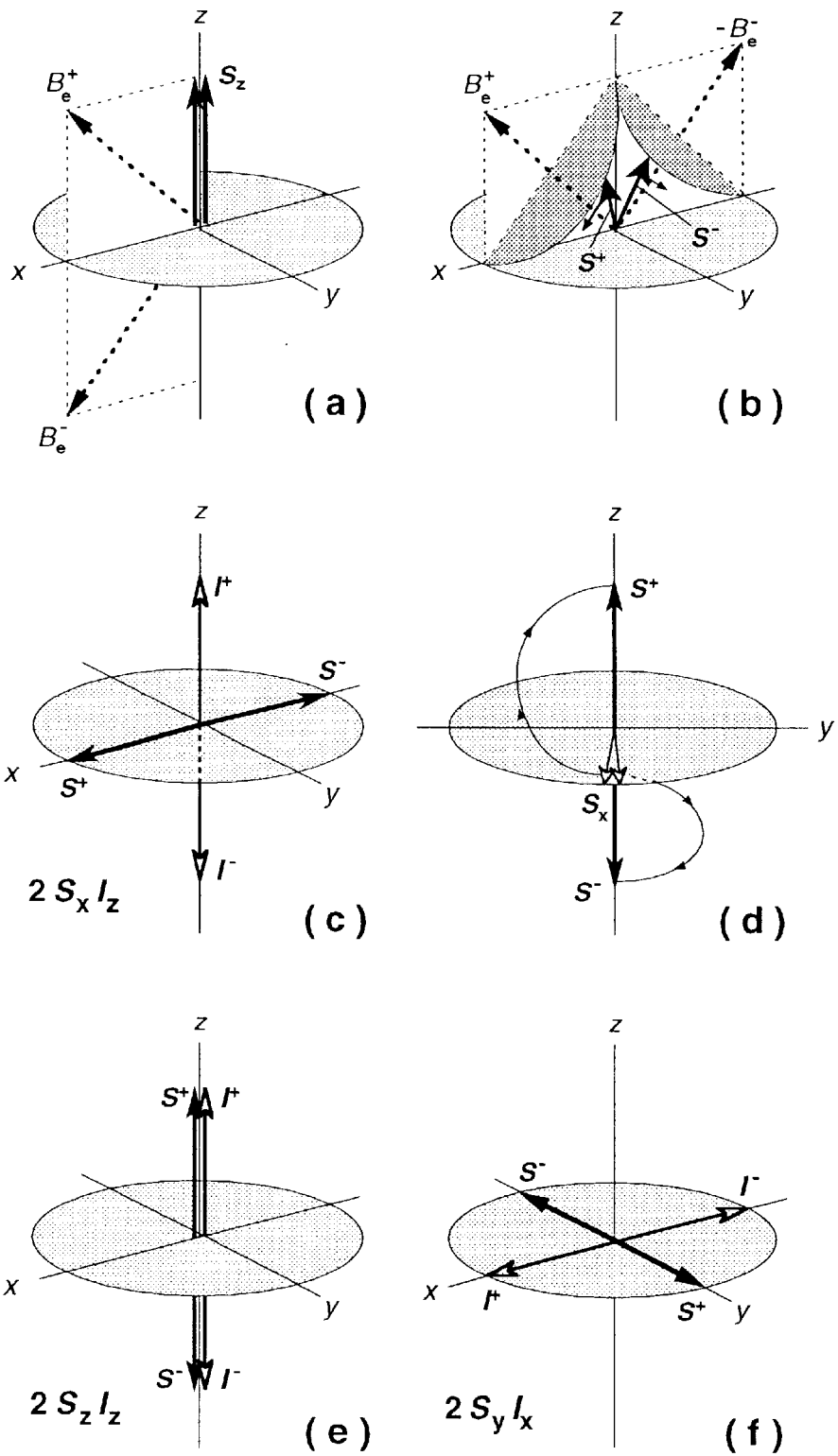

FIG. 2 pictures some classical rotations of an S spin coupled to an I spin and illustrates the various possible types of PO spinstates for an IS spin system.

Figure 3:
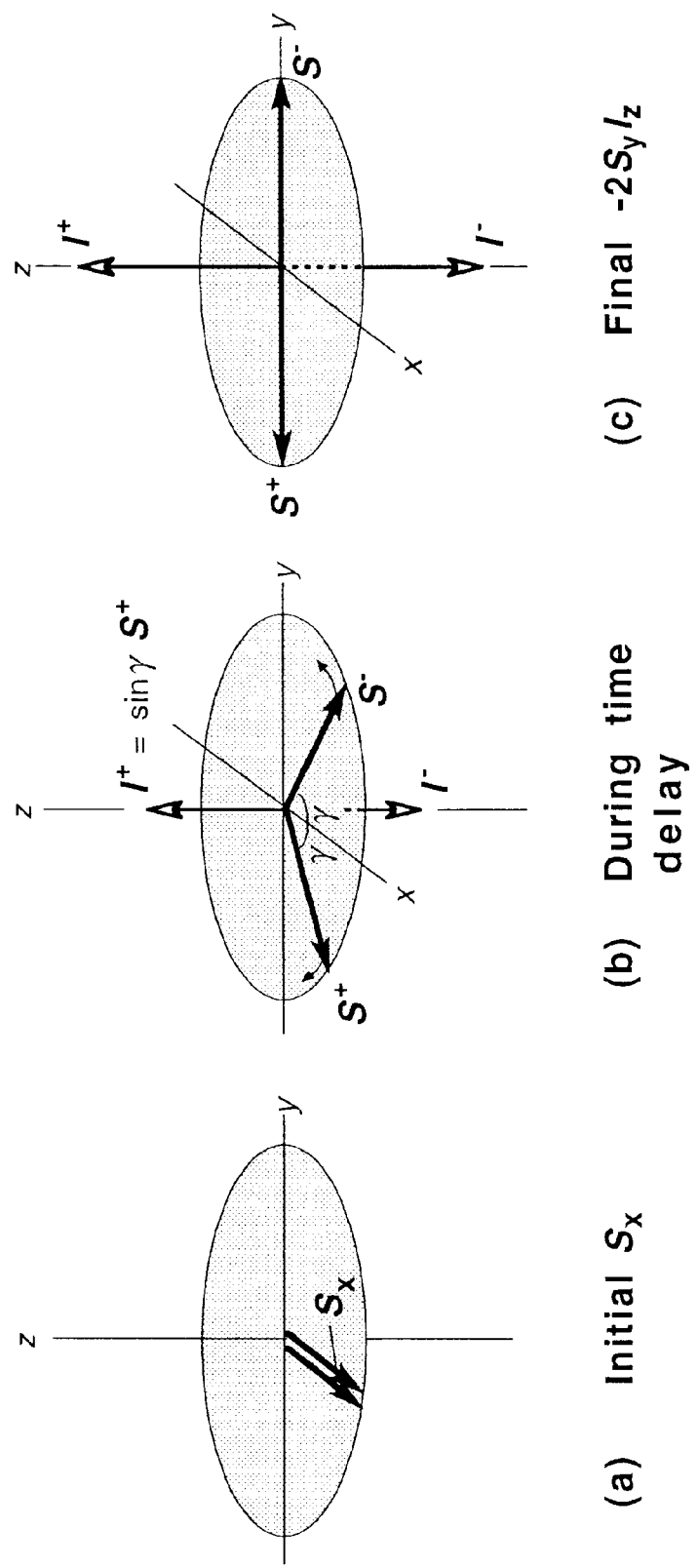

FIG. 3 establishes the experimentally-measurable I-spin magnetizations resulting from initial in-phase S-spin magnetization.

FIG. 4 describes some nonclassical rotations for on-resonance RF irradiation of an I spin subsequent to excitation of the S spin beginning with the $S_x$ product operator spinstate.

Figure 5:
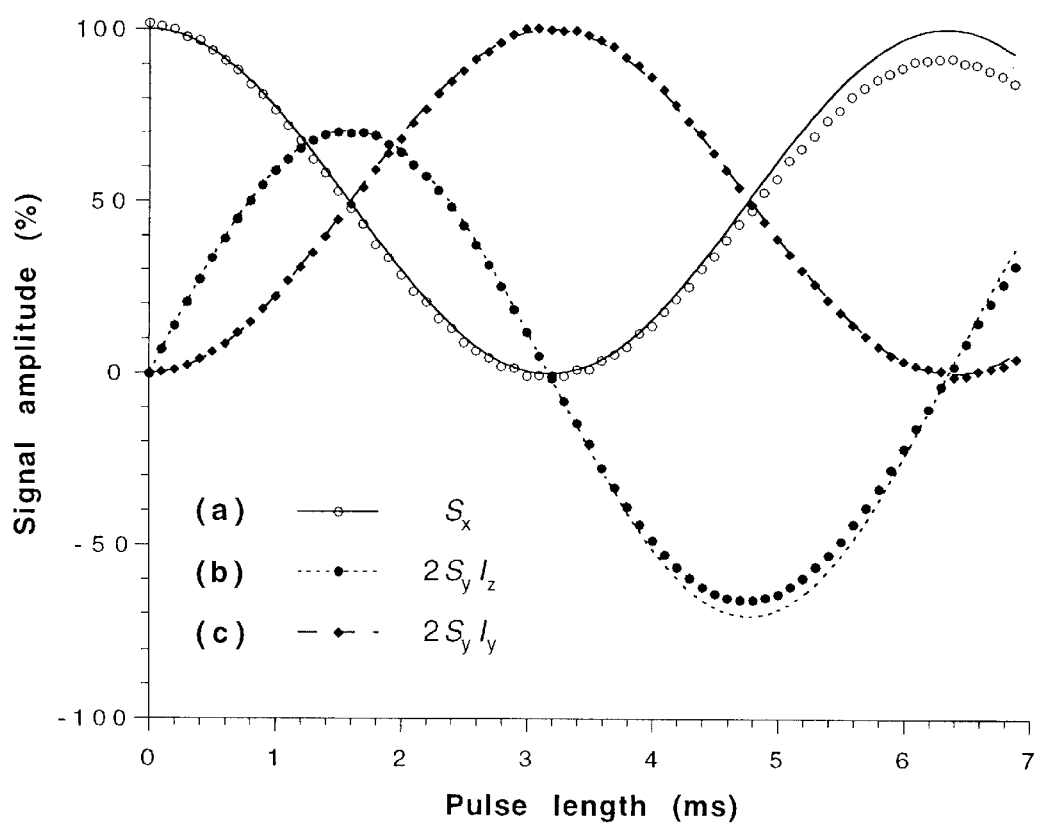

FIG. 5 graphs experimental results for the nonclassical rotation pictured in FIG. 4 for an RF field strength of $B_1=J/2$.

FIG. 6 shows in diagrammatic matrix form the 225 terms for an IS spin system subject to irradiation of the I spins.

Figure 7:
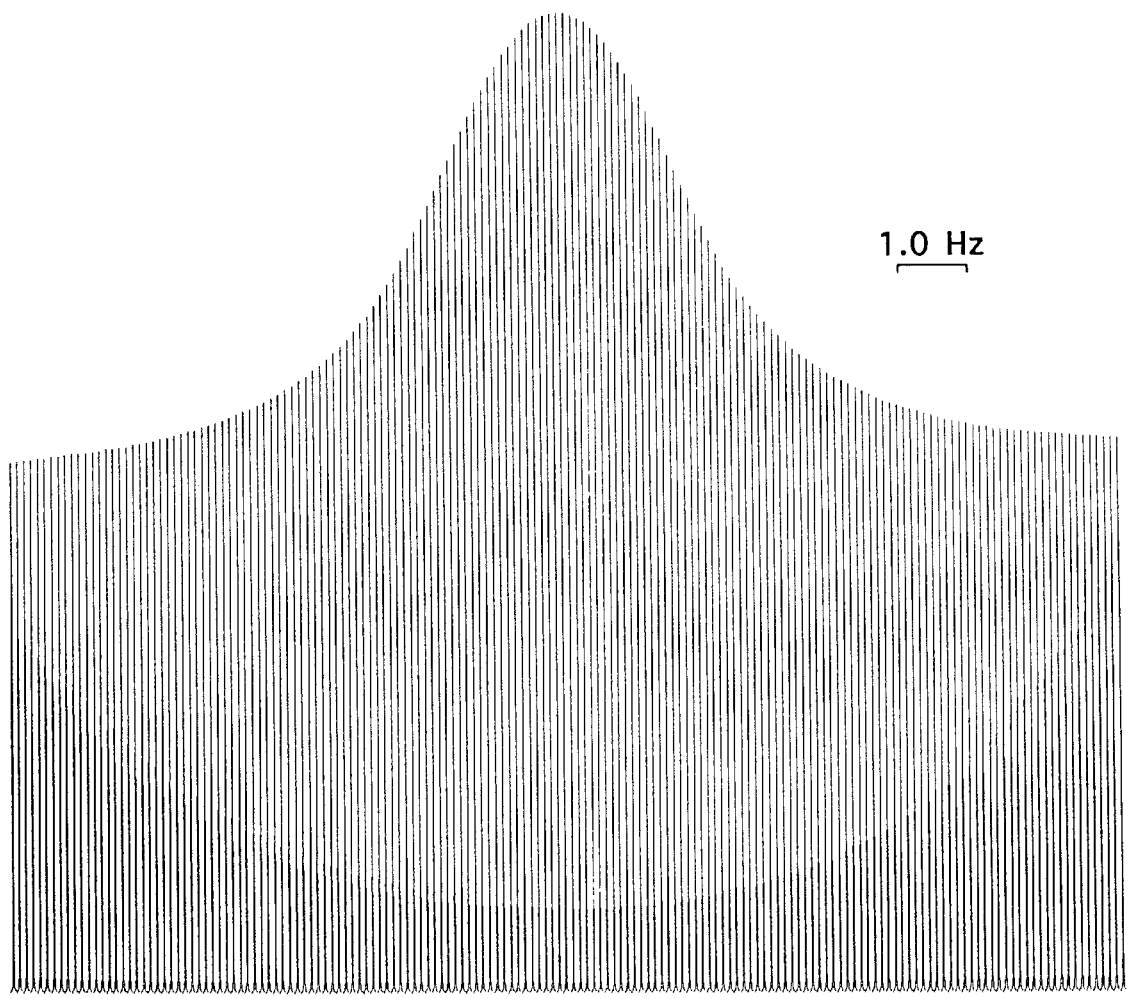

FIG. 7 demonstrates the RF frequency calibration of the I-spin decoupler channel.

Figure 8:
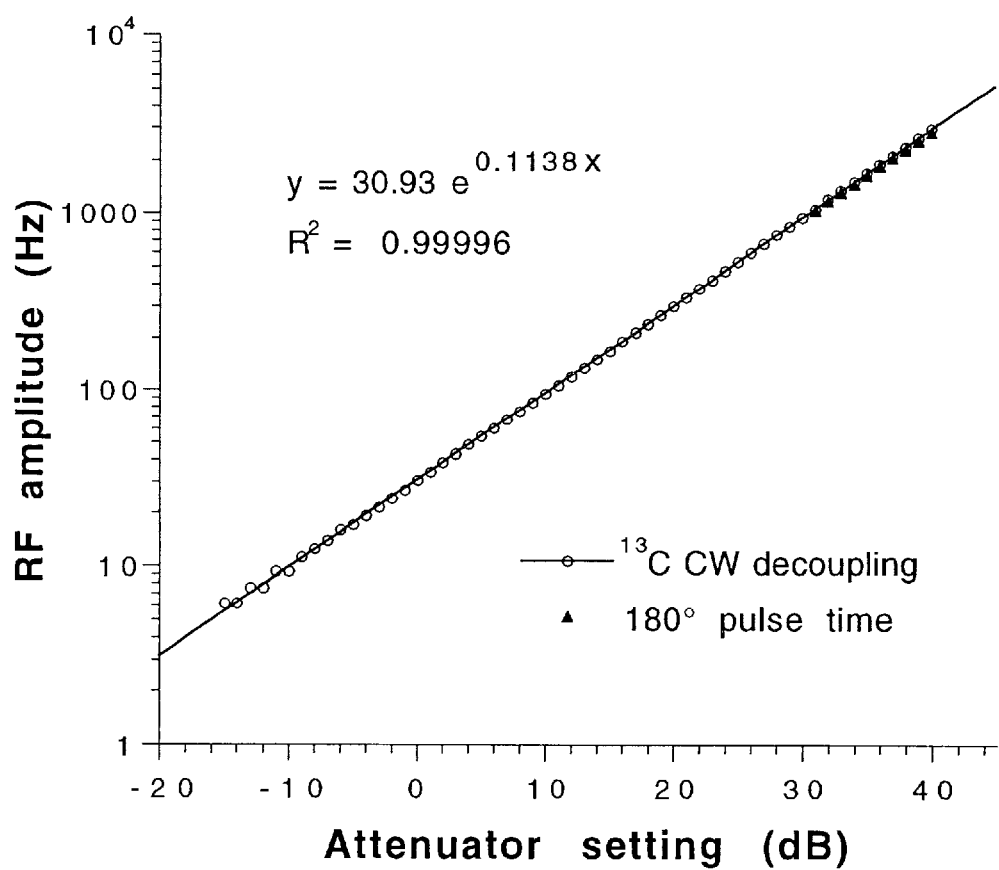

FIG. 8 illustrates an amplitude calibration of the I-spin decoupler channel.

Figure 9:
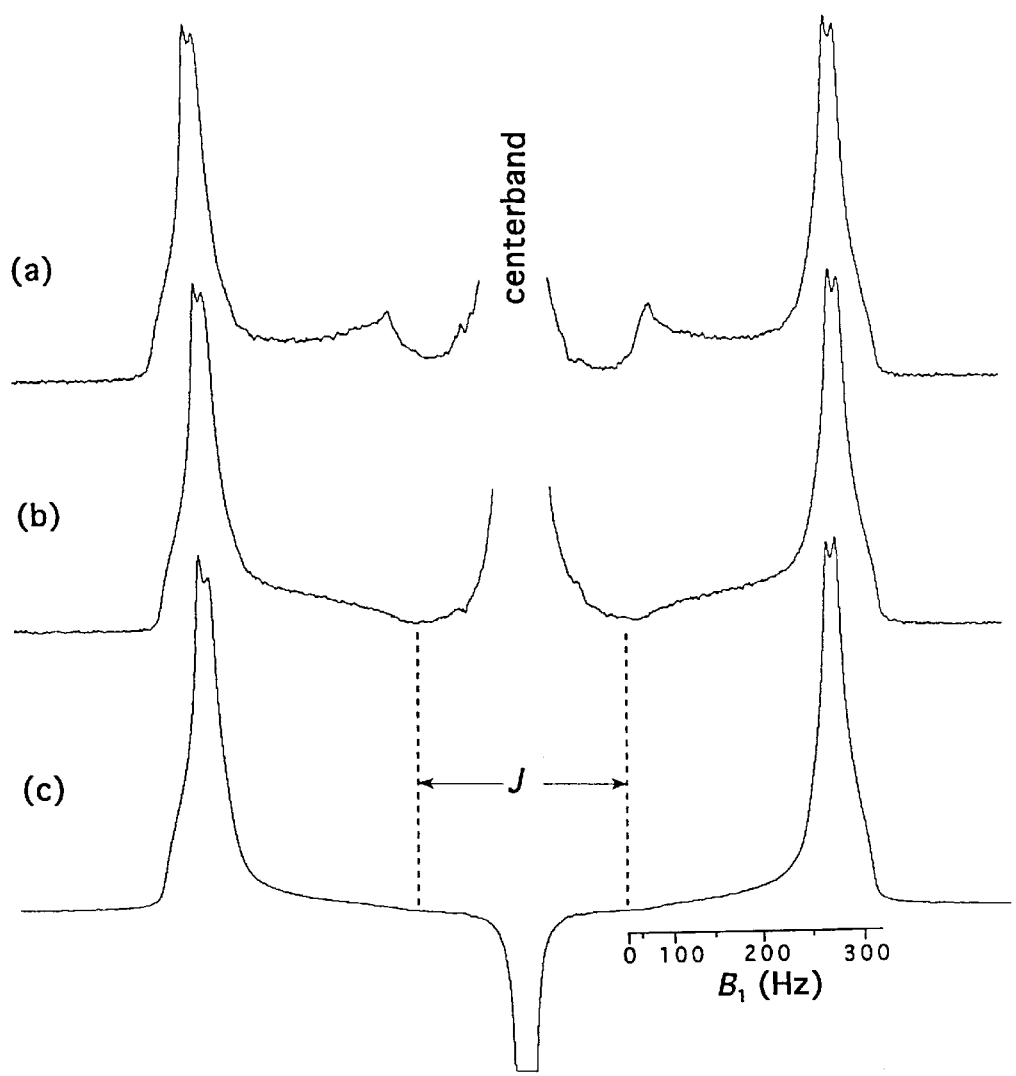

FIG. 9 provides ID spectra showing the extent of RF inhomogeneity for a typical I-spin decoupler channel.

Figure 10:
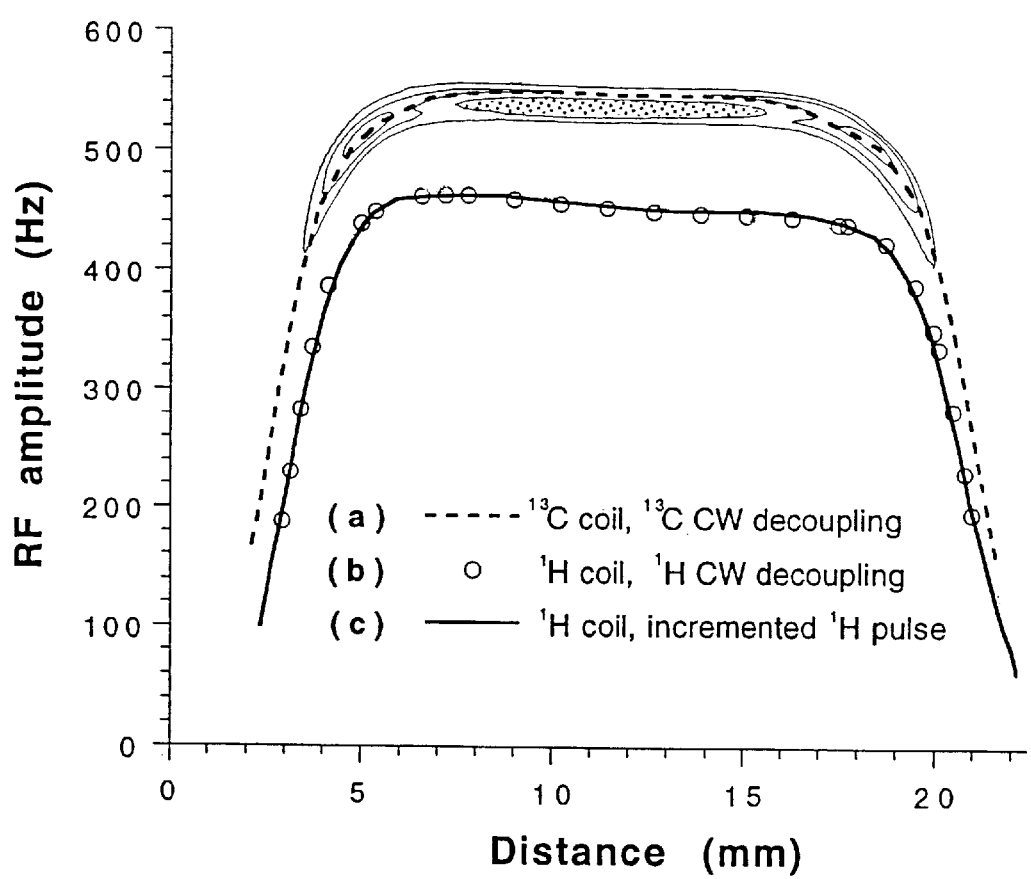

FIG. 10 displays profiles of RF amplitude, obtained from 2D images, along the sample axis, for both I-spin and S-spin channels.

Figure 11:
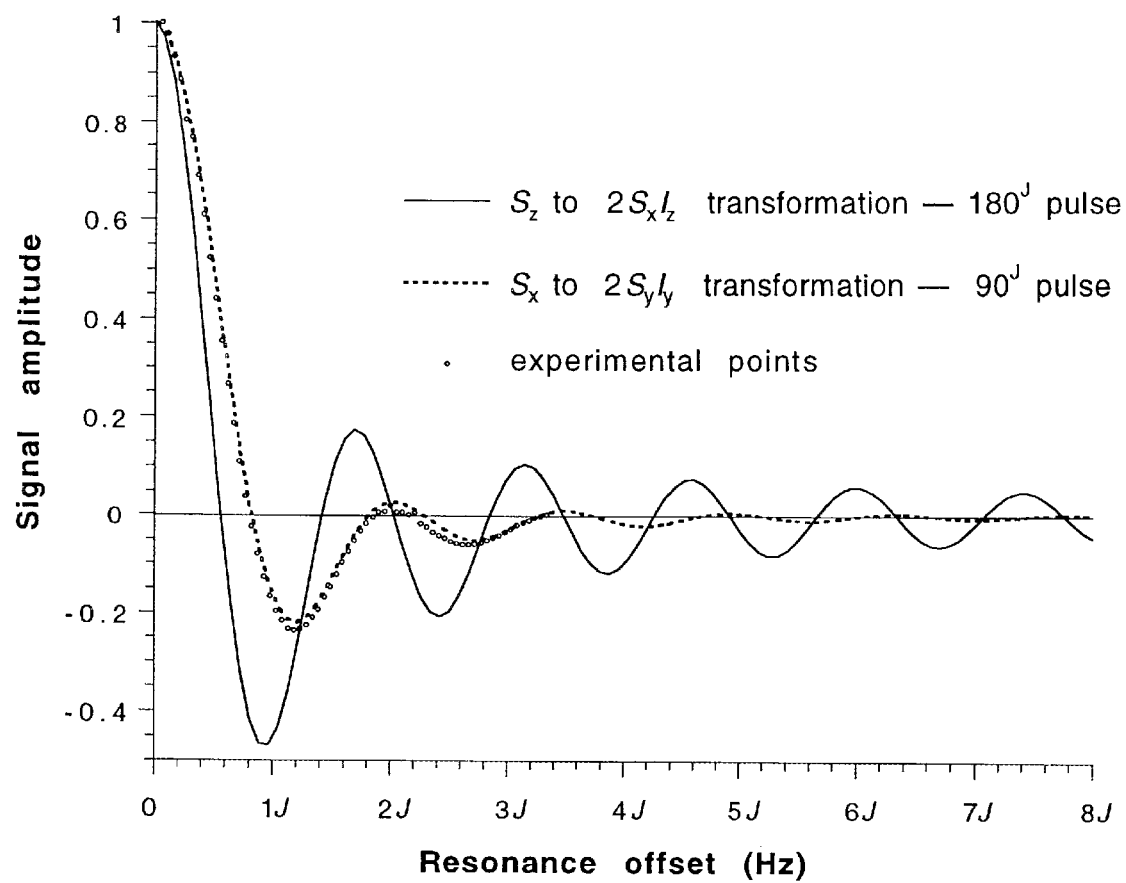

FIG. 11 presents the results of calculations of constant amplitude 180' and 90' frequency selective pulses.

Figure 12:
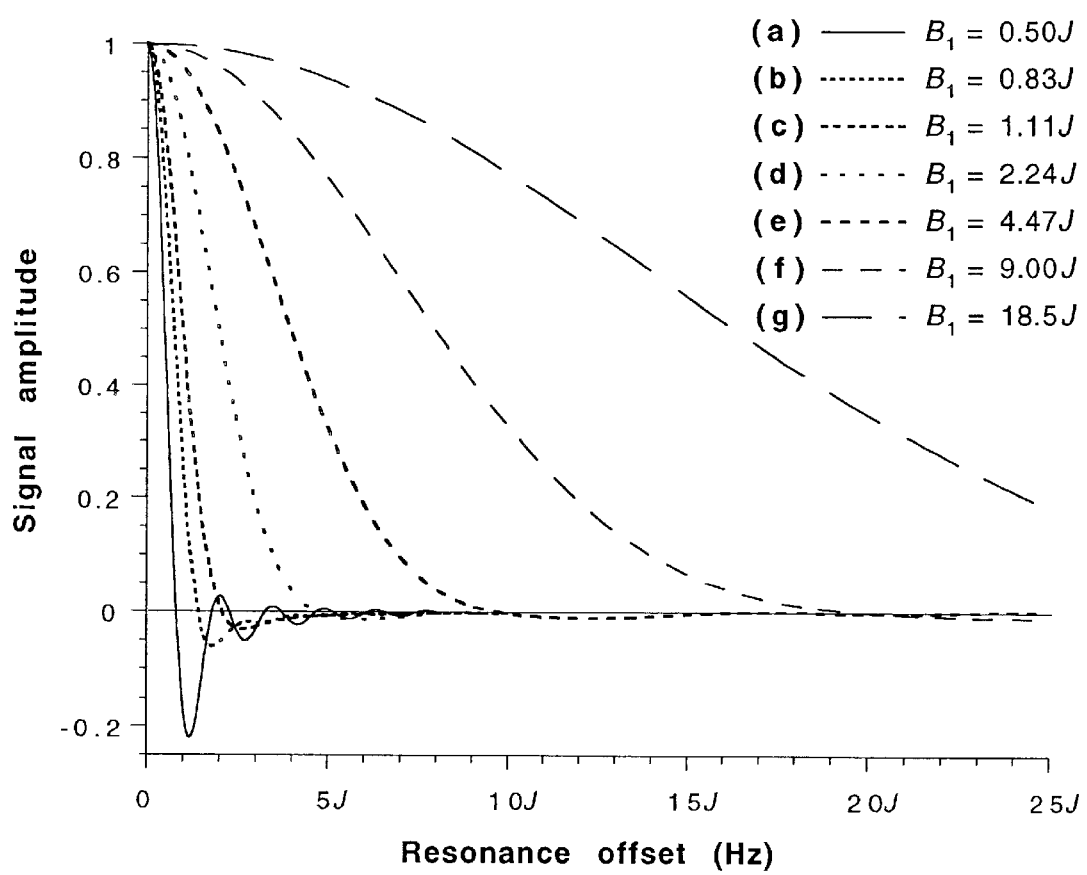

FIG. 12 provides examples of shaped J pulses of increasing bandwidth.

Figure 13:
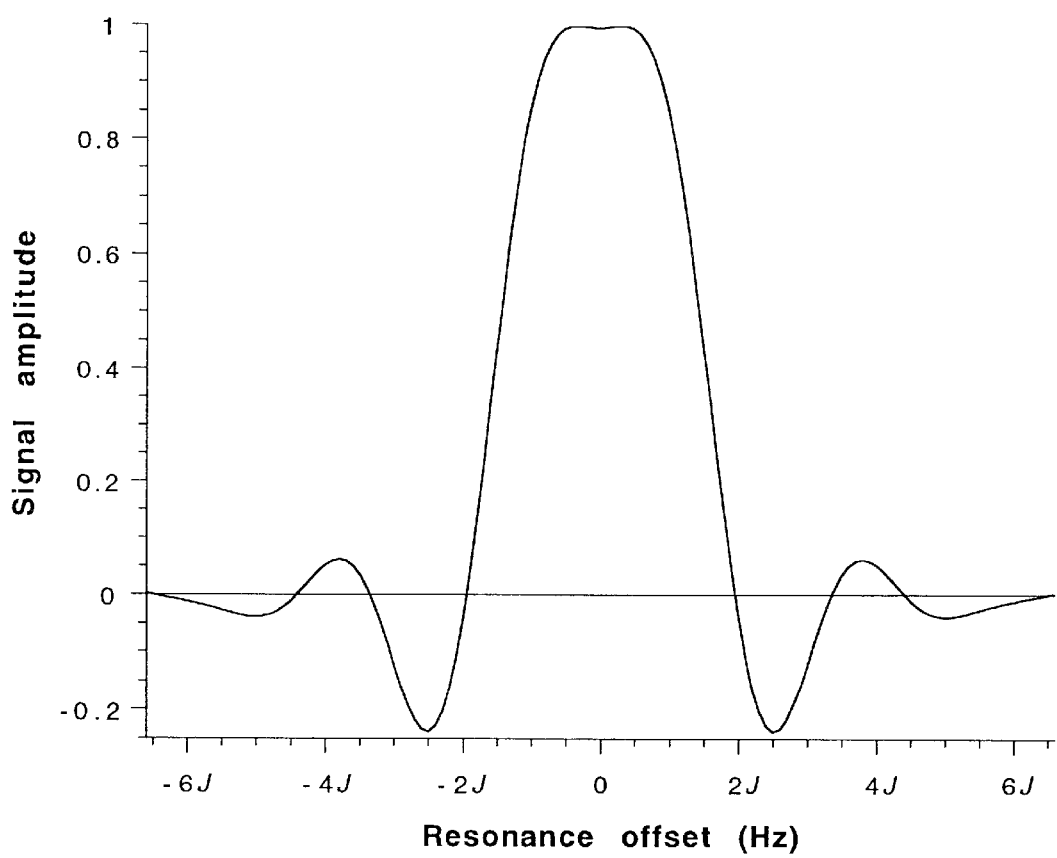

FIG. 13 exemplifies a shaped J pulse with increased bandwidth and squarer frequency offset profile.

THEORETICAL QUANTUM MECHANICAL BASIS OF THE INVENTION

These various embodiments of the invention derive from our solutions for the time-dependent density operator, $\rho(t)$, resulting from CW decoupling (RF of constant amplitude, phase, and frequency) applied to the various initial configurations of an IS spin system. We have calculated the evolution of the total density operator for the spin system, which includes the observed spectrum emphasized by earlier treatments (Anderson and Freeman, Journal of Chemical Physics 37, 85 (1962); Waugh, Journal of Magnetic Resonance 49, 517 (1982); comprehensive review by Shaka and Keeler, Progress in NMR Spectroscopy, 19, 47 (1986)) as a small fraction of the complete treatment summarized here. The desired PO form of the solution, i.e. the separation of $\rho(t)$ into the magnitude of the pure PO spinstates, arises as a result of factoring the time-dependent density operator into a linear combination of I-spin angular momentum operators times a sum of S-spin operators. The coefficients of individual spinstate terms, listed in the following as analytical expressions, are derived from 2×2 matrices and do not require diagonalization of large matrices, ensuring the calculations remain efficient and no approximations are required. In consequence, the entire set of 225 solutions for an IS spin system, for example, can be written down in explicit form and yield exact, completely definable, analytical equations. These 225 equations provide a basis for the invention.

The various forms of the invention are not, however, restricted to a coupled IS spin system. The following theory is generalized to a coupled $I_m S_n$ spin system and thus various embodiments of the invention may be generalized to a coupled $I_m S_n$ spin system.

Complete information on the state of an NMR system at a given time is contained in the density operator for the system. The time evolution of the density operator is determined by the Hamiltonian for the system. Both of these terms will be defined more fully in the following. The density operator can be usefully represented as a linear combination of any set of basis operators, as described by Søorensen, Eich, Levitt, Bodenhausen, and Ernst (Progress in NMR Spectroscopy 16, 163–192 (1983)) for the particular set of orthogonal Cartesian product operators. Other basis sets are useful (e.g., Sanctuary, Journal of Chemical Physics, 64, 4352–4361 (1976); Nakashima and McClung, Journal of Magnetic Resonance, 70, 187–203 (1986); Bain, Progress in NMR Spectroscopy 20, 295–315 (1988)), and the transformations between basis sets is straightforward. The method described in the following calculates the density operator and provides exact analytical solutions in terms of the Cartesian product operators. However, the method is general and applies to any basis set for the density operator. The analytical solutions obtained can be readily transformed to any desired basis set.

Transverse S Spinstates

In the following, the density operator solution is provided in Eq. [38] for a general $I_m S_n$ system for initial states composed of transverse S-spin operators (i.e., x or y components). The solution is compact, being composed of terms derived for simpler spin systems. In order to make clear the final, most general result, the formalism is first described in some detail for an $IS_n$ system, which provides the basis for the extensions which follow.

$IS_n$ Systems

The Hamiltonian. In units of angular frequency, the effective RF field in the rotating frame of the I spins is $$\omega_e(t) = \omega_{rf}(t)[\cos \phi(t)\hat{x} + \sin \phi(t)\hat{y}] + \delta(t)\hat{z} \qquad [1]$$

which encompasses any desired modulation of the amplitude ($\omega_{rf}$), phase ($\phi$), and frequency offset ($\delta$), where offset is measured from the center of the I-spin sweep width. For the following QM threory, we use the convention of right-hand rotations about any general $\omega = -\gamma B$, so that, for example, an on-resonance RF pulse applied along the +x axis in the rotating frame produces, for positive $\gamma$, a right-hand rotation about $-x$. The RF phase $\phi$ is always the phase of $\omega_{rf}$ in this convention, whereas the phase of the RF field depends on the sign of $\gamma$. The time dependent Hamiltonian for an $IS_n$ system can be written in the form $$\mathcal{H}(t) = \omega_e(t) \cdot I + \mathcal{J} I_z \sum_{i=1}^{n} S_{iz}, \qquad [2]$$

where $\mathcal{J}$ is $2\pi$ times the coupling, J, in Hz and $S_{iz}$ is the z component of the $i^{th}$ S spin. Each operator is implicitly a direct product of the form $V^1 \otimes V^{S1} \otimes \ldots \otimes V^{Sn}$ on for the (n+1) two-dimensional operators from each vector space of the individual I- and S-spin operators. Since operators from the different spaces commute, we will not necessarily maintain this particular ordering of the operators in what follows. The projection operators $P_i^{\pm}$ onto the spin-up (+) or spin-down (−) states in the $S_i$ subspace are written in terms of $S_{iz}$ and the identity operator, $E_i$, as $$P_i^{\pm} = 1/2 E_i \pm S_{iz}, \qquad [3]$$

so that $$E_i = P_i^+ + P_i^- \qquad [4]$$

and $$S_{iz} = 1/2(P_i^+ - P_i^-). \qquad [5]$$

In the vector space of an $IS_3$ system, for instance, we represent $I_z S_{1z}$ as $1/2 I_z (P_1^+ - P_1^-) E_2 E_3$.

The Hamiltonian, recast in terms of these operators, is $$\mathcal{H}(t) = \omega_e(t) \cdot I \prod_{i=1}^{n}(P_i^+ + P_i^-) + \mathcal{J}/2 I_z \sum_{i=1}^{n}(P_i^+ - P_i^-) \prod_{j \neq i}^{n}(P_j^+ + P_j^-). \qquad [6]$$

Performing the multiplications and grouping like terms yields a more concise expression. Define $$\omega_q(t) = \omega_e(t) + q\mathcal{J}/2\hat{z} \qquad [7]$$

as the equivalent effective field seen by an uncoupled I-spin at a resonance offset $\delta + q\mathcal{J}/2$, oriented at an angle $\theta_q$ from the z axis given by $$\tan \theta_q = \omega_{rf}/[\delta + q\mathcal{J}/2]. \qquad [8]$$

Then, for example, with n=2, $$\mathcal{H}_{(n=2)} = (\omega_c \cdot I + 2\mathcal{J}/2 I_z) P_1^+ P_2^+ + (\omega_c \cdot I + 0\mathcal{J}/2 I_z)(P_1^+ P_2^- + \qquad [9]$$

-continued
$$P_1^- P_2^+) + \omega_c \cdot I - 2\mathcal{J}/2 I_z) P_1^- P_2^-$$
$$= \omega_{(+2)} \cdot I P_1^+ P_2^+ + \omega_{(0)} \cdot I(P_1^+ P_2^- + P_1^- P_2^+) + \omega_{(-2)} \cdot I P_1^- P_2^-$$

More generally, for n spin-1/2 S operators, the maximum total S spin is n/2, with z components n/2, (n/2−1), ..., −n/2. For each product $p_1^{q_1} \ldots P_n^{q_n}$ that appears in H, as illustrated above, the sum of the angular momenta $q_i = \pm 1$ (in units of half-integral spin) associated with the individual $P_i^{\pm}$ is $$q_s = \sum_{i=1}^{n} q_i, \qquad [10]$$

which equals the coefficient of $\mathcal{J}/2$. We therefore write $$\mathcal{H}(t) = \sum_{q_1, \ldots, q_n = \pm 1} \omega_{q_s}(t) \cdot I \prod_{j=1}^{n} P_j^{q_j}, \qquad [11]$$

which merely says that for an $IS_n$ system, the values of $q_s$ range from +n to −n, with $\Delta q_s = 2$. Each $\omega_{q_s} \cdot I$ is multiplied by all possible ways of generating a product of n different projection operators with total spin equal to $q_s$, for a total of $2^n$ terms, as illustrated previously for the n=2 case in Eq. [9]. For n=3, there are terms $\omega_{\pm 3} \cdot I P_1^{\pm} P_2^{\pm} P_3^{\pm}$ and three terms for $\omega_{\pm 1}$ involving two $P^{\pm}$ and one $P^{\mp}$. The Hamiltonian for an IS system written in this form consists of the two comparatively simple terms $\omega_{\pm 1} \cdot I P_1^{\pm}$. The basic constructs used in Eq. [11] and, hence the simple algorithm described above, appear frequently as elements in the calculations which follow. Differences in the scalar couplings are readily incorporated by changing the component $q_s \mathcal{J}/2$ in each $\omega_{q_s}$ defined by Eq. [7] to $$\sum_{j=1}^{n} q_j \mathcal{J}_1/2.$$

Thus, $\omega_{+1}$ in a term such as $\omega_{+1} \cdot I P_1^+ P_2^- P_3^+$ would become $\omega_e + (J_1 - J_2 + J_3)/2 \hat{z}$, for example.

The Time Evolution Operator. The RF generated by the spectrometer is normally a digitized approximation of a continuous waveform in which the RF amplitude, phase, and frequency are constant during time increments that sequentially comprise the overall pulse sequence. During individual RF pulses, these time increments are most commonly intervals of fixed length $\Delta t$. Thus, the Hamiltonian is time-independent at each time $t_k = k\Delta t$, and the exact expression for time-development operator or propagator $U(t_k, t_{k-1})$ between times $t_{k-1}$ and $t_k$ is simply $\exp[-i H(t_k) \Delta t]$. In Eq. [11], the direct product of the n projection operators in each term sets one of the diagonal elements of the resulting $2^n \times 2^n$ projection operator equal to one and all other elements equal to zero. We define $\omega_q^k = \omega_q(t_k)$ and unit vector $\hat{\omega}_q^k = \omega_q^k/|\omega_q^k|$ with components determined by Eq. [7], together with a rotation angle $$\beta_q^k = 1/2 \omega_q^k \Delta t. \qquad [12]$$

The propagator in matrix form is composed of the 2×2 elements $$U_q(t_k, t_{k-1}) = \exp[-i\omega_q^k \cdot I \Delta t] \quad [13]$$

$$= \cos\beta_q^k - 2i(\hat{\omega}_q^k \cdot I)\sin\beta_q^k$$

$$= \begin{pmatrix} a_q^k & b_q^k \\ -b_q^{k*} & a_q^{k*} \end{pmatrix}$$

along the diagonal, where $$a_q^k = \cos\beta_q^k - i\hat{\omega}_{q,z}^k \sin\beta_q^k$$

$$b_q^k = -(\hat{\omega}_{q,y}^k + i\hat{\omega}_{q,x}^k)\sin\beta_q^k \quad [14]$$

are the standard Cayley-Klein parameters for a rotation by $2\beta_q^k$ about $\hat{\omega}_q^k$, and (*) represents complex conjugation. For the n=2 example, the diagonal elements are $U_2$, $U_0$, $U_0$, and $U_{-2}$, with multiplicities determined by the number of ways to combine n projection operators with total spin quantum number q. Starting at time $t_0$, the propagator to any later time $t_k$ is obtained by successive application of the propagators for each of the k intervals, and the block-diagonal structure of U ensures that each block will also be a concatenation of the $U_q$, so that $$U(t_k, t_0) = \sum_{q_1, \ldots, q_n = \pm 1} U_{q_s}(t_k, t_0) \prod_{j=1}^{n} P_j^{q_j}, \quad [15]$$

similar to Eq.[11]. For a truly continuous RF waveform, this expression for the propagator would be an approximation that can be made as accurate as desired by decreasing the interval $\Delta t$. We will use the abbreviated notation $a_q$ and $b_q$ to describe either the incremental form $U_q(t_k, t_{k-1})$ or the total effective propagator $U_q(t_k, t_0)$ in the subspace labeled by q when the distinction is clear from the context in which they are used.

The Density Operator. The state of the system at time t is embodied in the density operator, which evolves from an initial state $\rho(t_0)$ according to the relation $$\rho(t) = U(t, t_0)\rho(t_0)U^\dagger(t, t_0). \quad [16]$$

We consider the set of four initial conditions $$\rho_\nu(t_0) \in \{S_x, 2S_yI_x, 2S_yI_z\} \quad (\nu=0, 1, 2, 3) \quad [17]$$

composed of transverse S-spin operators and assign the label $\nu$ sequentially to members of the set. We write the $x_j$ component of the I spin as $I_{x_j}$ for $(x_1, x_2, x_3) = (x, y, z)$ and define $I_{x_0} = 1/2E$, giving $\rho_0(t_0) = 2S_xI_{x_0}$ to complete the symmetry of the set. As will be shown in the following, the set is closed for an IS system in the sense that there is no evolution to any state that is not a member of the set. Each S-spin operator is a sum $\Sigma_{j=1}^n S_j$, which is implicit in the notation. We also employ the usual raising and lowering operators $$S_j^\pm = S_{jx} \pm iS_{jy}, \quad [18]$$

which can be obtained by interchanging the two columns of $P_j^\pm$ in the matrix$_{x_j}$ representation.

In the calculation of $\rho_\nu(t)$, the product $U\rho_\nu(t_0)$ produces terms $P_j^\pm S_{jx} = (1/2)S_j^\pm$ and $P_j^\pm S_{jy} = \mp(i/2)S_j^\pm$. The operators $(P_j^\pm)^\dagger$ in the adjoint operator $U^\dagger$ are equal to $P_j^\pm$, giving terms $P_j^\pm P_j^\mp = 0$, $S_j^\pm P_j^\pm = 0$, and $S_j^\pm P_j^\mp = S_j^\pm$. Thus, the only nonzero terms in Eq. [16] are those containing factors of the form $P_j^\pm S_{jx} P_j^\mp = (1/2)S_j^\pm$ and $P_j^\pm S_{jy} P_j^\mp = \mp(i/2)S_j^\pm$. This reduces the density operator to an expression similar to Eq. [9], with the product of projection operators in each term replaced by the sum of unique products in which a single $P_j^\pm$ is converted to $S_j^\pm$. As an example using the initial condition $\nu=2$ for the $IS_2$ case, $$U = P_1^+P_2^+U_{(+2)} + (P_1^+P_2^- + P_1^-P_2^+)U_{(0)} + P_1^-P_2^-U_{(-2)}$$

$$\rho_2(t_0) = 2I_y(S_{1y} + S_{2y})$$

$$U^\dagger = P_1^+P_2^+U_{(+2)}^\dagger + (P_1^+P_2^- + P_1^-P_2^+)U_{(0)}^\dagger + P_1^-P_2^-U_{(-2)}^\dagger. \quad [19]$$

Picking out the nonzero terms from the product $U\rho_2(t_0)U^\dagger$ and using the relation $S^- = (S^+)^\dagger$ results in terms of the form $$Z = (S_1^+P_2^+ + P_1^+S_2^+)U_{(+2)}2I_yU_{(0)}^\dagger + (S_1^+P_2^- + P_1^-S_2^+)U_{(0)}2I_yU_{(-2)}^\dagger, \quad [20]$$

to give $$\rho_2(t) = -i/2[Z - Z^\dagger] \quad [21]$$

$$= \text{Im}[Z].$$

For the other initial conditions, the I-spin operator becomes $I_{x_\nu}$ in the expression for Z. In addition, for initial $S_x$ ($\nu=0$), the terms $P_j^\pm S_{jx} P_j^\mp = (1/2)S_j^\pm$ that arise in the calculation of $\rho_0(t)$ give only positive coefficients to produce terms of the form $Z + Z^\dagger$, resulting in the real part of Z instead of the imaginary part.

Therefore, for general n, the simple algorithm that generates the equation for $\rho_\nu(t)$ is (i) construct the terms $U_{(q)}2I_{x_\nu}U_{(q-2)}^\dagger$ for $q = n, n-2, \ldots, -(n-2)$ and then (ii) multiply each term by all combinations of a single $S_i^+$ (i=1, \ldots, n) and n−1 operators $P_j^\pm$ (j≠i) with total angular momentum equal to q. This procedure is described more formally by the expression $$Z_\nu(t) = \sum_{i=1}^{n} \sum_{\substack{q_1, \ldots, q_n = \pm 1 \\ q_i \neq -1}} [U_{(q_s)}2I_{x_\nu}U_{(q_s-2)}^\dagger] \left[S_i^{q_i}\prod_{j\neq i}^{n} P_j^{q_j}\right], \quad [22]$$

giving $$\rho_\nu(t) = \begin{cases} \text{Re}[Z_\nu] & \nu = 0 \text{ (Initial in-phase } S_x) \\ \text{Im}[Z_\nu] & \nu \neq 0 \text{ (Initial } 2S_yI_{x_\nu} \text{ coherence)} \end{cases} \quad [23]$$

The bracketed expressions in Eq. [22] provide, in turn, the I-spin and S-spin constituents of $\rho_\nu(t)$.

The solution for the density operator can thus be reduced to calculating the general products $U_q 2I_{x_\nu} U_r^\dagger$. Using Eq.[13] for the effective propagator in each subspace, these can be expanded as linear combinations of the Pauli basis set, $2I_\mu$, as $$U_q 2I_{x_\nu} U_r^\dagger = \sum_{\mu=0}^{3} \alpha_{\nu\mu}^{(q,r)} 2I_{x_\mu} \quad [24]$$

to obtain the simple expressions for the expansion coefficients $[\alpha]_\mu$ listed in TABLE 1 as a function of the indices $\nu$, q, and r. TABLE 2 translates these coefficients to their expressions in terms of the C-K parameters.

The solution for the density operator is completed using Eq. [18] for $S_i^+$ and Eq. [3] for $P_j^\pm$ to perform the multiplications in Eq.[22], keeping only the real terms for initial in-phase magnetization or the imaginary terms for coherences $2S_y I_{x_j}$ at the start of the RF irradiation. As an illustration, we consider the solution $\rho_\nu(t)$ that evolves when RF is applied to the I spins in an $IS_3$ system that is initially in the $\nu=0$ state, $\nu_0(t_0)=S_x$. According to Eq. [23], $\rho_0(t)=\text{Re}[Z_0]$, and $Z_0$ is easily constructed by analogy to the $IS_2$ example given in Eq. [21] for $\nu=2$ (see, for example, the text preceding Eq. [22], which formally defines the algorithm). The elements $\alpha_{0\mu}$ for general $(q, r)$ listed in row $\nu=0$ of TABLE 1 determine the components $I_{x_\nu}$ in $Z_0$. Since $\alpha_{00}$ is real, only terms involving $S_{ix}$ and $S_{jz}$, from the products $S_i^\pm P_j^\pm$ are associated with $2I_{x_0}=E$. Since the $\alpha_{0j}$ ($j=1, 2, 3$) are imaginary, Re $[Z_0]$ associates similar terms involving $S_{iy}$ and $S_{jz}$ with $2I_{x_j}$. In the interest of brevity, we write out fully only the terms involving $S_{ix}$ to obtain $$\rho_0(t) \propto \text{Re}[A_0^{(3,1)} + 2A_0^{(1,-1)} + A_0^{(-1,-3)}] \sum_{i=1}^n (S_i)_x + \quad [25]$$

$$\text{Re}[A_0^{(3,1)} - A_0^{(-1,-3)}]2[S_{1x}(S_{2z} + S_{3z}) +$$

$$S_{2x}(S_{1z} + S_{3z}) + S_{3x}(S_{1z} + S_{2z})] +$$

$$\text{Re}[A_0^{(3,1)} - 2A_0^{(1,-1)} + A_0^{(-1,-3)}]4[S_{1x}S_{2z}S_{3z} + S_{2x}S_{1z}S_{3z} +$$

$$S_{3x}S_{1z}S_{2z}] + \{2S_y I_{x_j} + \dots \text{ terms}\}$$

Coefficients of the $2S_y I_{x_j}$ terms have the same functional form shown above for the $S_x$ terms, but are constructed from other elements.

Thus, there are n levels of product operator terms for an $IS_n$ system, depending on the number of S-spin operators in the product. The functions $F_i^n(\Omega)$ listed in row i, column n of TABLE 3 multiply terms consisting of products of i S-spin operators, with $i \leq n$. The $F_i^n$ with $i > n$ are zero, so the solutions for $\rho_\nu(t)$ become progressively simpler for smaller n. For an $IS_2$ system, terms involving $S_{3x}$ and $S_{3z}$ are eliminated, and the coefficients change to the form given in column 2 of TABLE 3. For an IS system, there are no terms involving $S_{2x}$ and $S_{2z}$, and the coefficients change to the form given in column 1 of TABLE 3. The particular arguments $\Omega_{\nu\mu}$ of the functions depend on the initial condition, denoted by $\nu$, and on the component $2I_{x_\mu}$ in the product. They are listed in TABLE 4 for general $(q, r)$ in terms of $A_\nu$ and $B_\nu$ tabulated earlier in TABLE 2. For example, the terms involving operator $2I_x$ in Eq. [25] ($n=3$) require $\Omega_{01}$ of TABLE 4 and the three functions $f_i^3$ of $\Omega_{01}=\text{Im}[B_0]$ in column 1 of TABLE 3. We merely take the terms involving $2I_{x_0}$ which are written out fully as functions of $\Omega_{00}^{(q,r)}=\text{Re}[A_0^{(q,r)}]$ and change $I_{x_0}$ to $I_x$, $S_x$ to $S_y$, and $\text{Re}[A_0]$ to $-\text{Im}[B_0]$. The remaining terms are generated similarly using the other elements in row zero of TABLE 4. Solutions for the evolution of initial states labeled by index $\nu$ in Eq. [17] are constructed similarly using row $\nu$ of TABLE 4.

The final result for general n and initial condition $\nu$ can be written succinctly as $$\rho_\nu(t) = \frac{1}{2^{n-1}} \quad [26]$$

$$\sum_{i=1}^n \left\{ S_{i,x} \left\{ f_1^n(\Omega_{\nu 0}) + 2 \sum_{j \neq i}^n S_{j,z} \left[ f_2^n(\Omega_{\nu 0}) + 2 \sum_{\substack{k > j \\ k \neq i}}^n S_{k,z} f_3^n(\Omega_{\nu 0}) \right] \right\} + \right.$$

-continued $$\left. 2 \sum_{r=1}^3 I_{x_r} S_{i,y} \left\{ f_1^n(\Omega_{\nu r}) + 2 \sum_{j \neq i}^n S_{j,z} \left[ f_2^n(\Omega_{\nu r}) + 2 \sum_{\substack{k > j \\ k \neq i}}^n S_{k,z} f_3^n(\Omega_{\nu r}) \right] \right\} \right\}.$$

As an example, Eq. [25] was provided to show the explicit correspondence between terms involving $S_{i,x}$ in Eq. [26] for an $IS_3$ system starting with initial $S_x$ ($\nu=0$).

The observed signal, $\langle S_x(t) \rangle \propto \text{Tr}[S_x \rho_\nu(t)]$, is proportional to $F_1^n(Q0)$, since only the $S_x^2$ terms have nonzero trace. The other terms give the relative proportions of the different coherences that have evolved. Alternatively, the expansion in Eq.[24] can be performed just as readily in terms of either $I^\pm$ or the related spherical tensor basis if these forms of the solution are required, or the desired transformations between bases can be performed on the final result.

$I_m S_n$ Systems

The previous results can be extended to obtain the solutions for an $I_m S_n$ system. We write the $x_j$ component of the $i^{th}$ I spin as $I_{i,x_j}$. For the $i^{th}$ I spin, Eq. [11] becomes $$\mathcal{H}(t) = -\sum_{q_1,\dots,q_n=\pm 1} \omega_{q_s} \cdot I_i \prod_{j=1}^n P_j^{q_j}, \quad [27]$$

so that $H(t) = \sum_{i=1}^m H_i$. Although the Hamiltonian no longer exhibits the simple 2×2 block-diagonal structure of the $IS_n$ systems, the individual $H_i$ commute among themselves. In addition, all the terms in $H_i$ commute, since each term contains a unique product of projection operators, which guarantees the commutator has at least one product of the form $P_j^\pm P_j^\mp = 0$ for each term. The propagator is still written as in Eq. [15], but now $$U_{(q_s)}(t_k, t_0) = \prod_{i=1}^m U_{i(q_s)}(t_k, t_0). \quad [28]$$

The evolution of the density operator, described in Eqs. [16] through [23], follows immediately, with a minor modification to Eq. [22] for $Z_\nu$. Define the function $Y(m,q)$ as the product $$Y(m, q) = \prod_{k=1}^m U_{k(q)} U_{k(q-2)}^\dagger \quad [29]$$

and define $$Y(m, x_j, q) = \sum_{k=1}^m \left( U_{k(q)} 2I_{k,x_j} U_{k(q-2)}^\dagger \prod_{l \neq k}^m U_{l(q)} U_{l(q-2)}^\dagger \right). \quad [30]$$

Then

-continued $$Z_v(t) \rightarrow \begin{cases} \sum_{i=1}^{n} \sum_{\substack{q_1,\ldots,q_n=\pm 1 \\ q_i \neq -1}} \Upsilon(m, q_s) S_i^{q_i} \prod_{j \neq i}^{n} P_j^{q,j} & v=0 \\ \sum_{i=1}^{n} \sum_{\substack{q_1,\ldots,q_n=\pm 1 \\ q_i \neq -1}} \Upsilon(m, x_j, q_s) S_i^{q_i} \prod_{j \neq i}^{n} P_j^{q,j} & v \neq 0 \end{cases} \quad [31]$$

and the final solution for the density operator is still given by Eq.[23].

Single S-Spin. For in-phase $S_x$ at the start of the I-spin irradiation, $\rho_0(t)$ is obtained from $Z_0$ in Eq. [31] as $$\rho_0(t) = Re[S^+\Upsilon(m, +1)] = Re[(S_x i S_y)\Upsilon(m, +1)]. \quad [32]$$

According to Eq. [24] defining the general matrix $\alpha_{\nu\mu}^{(q,r)}$ listed in TABLE 1, $\Upsilon(m, q)$ is all possible products of m elements from row zero, so that, most generally, $$\Upsilon(m, q) = 2^m \sum_{\mu_1,\ldots,\mu_m=0}^{3} [\alpha_{0\mu_1}^{(q,q-2)} \ldots \alpha_{0\mu_m}^{(q,q-2)}][I_{\mu_1} \ldots I_{\mu_m}], \quad [33]$$

where $\alpha_{00}$ is pure real and $\alpha_{0j}$ (j=1, 2, 3) is pure imaginary.

The terms multiplying $S_x$ in Eq. [32] for $\rho_0(t)$ must be the real part of $\Sigma(m,+1)$, so the coefficient of $S_x = 2S_x I_{x_0}$ is immediately seen to be $(\alpha_{00}^{1,-1})^m = [Re(A_0^{1,-1})]^m$. Operators of the form $4S_x I_{x_j} I_{x_k}$ result from multiplying two elements from columns one through three for an $I_2S$ system and using $2I_{x_0}$ for the required third element in an $I_3S$ system. Terms multiplying $iS_y$ must be pure imaginary to produce a real result, leading to operators of the form $2S_y I_{x_j}$ and, for $I_3S$, additional operators $8S_y I_{x_j} I_{x_k} I_{x_l}$. The m=1 result for an IS system is given in Eq. [26] as functions of the pure real elements $\Omega_{\nu\mu}$ in TABLE 4, where $\alpha_{0j} = -i\Omega_{0j}$ and $\alpha_{j0} = i\Omega_{j0}$ (j=1, 2, 3). More generally, we can select the terms from Eq. [33] that satisfy the above requirements to define the resulting coefficients of the $S_x$ and $S_y$ operators in terms of general indices (q,r) as $$c_{0,x}^{(q,r)} = [\Omega_{00}^{(q,r)}]^m - \frac{m-1}{2^{m-2}} 4[\Omega_{00}^{(q,r)}]^{m-2} \sum_{k,l=1}^{3} \Omega_{0k}^{(q,r)} \Omega_{0l}^{(q,r)} \left( \sum_{p=1}^{m-1} \sum_{s>p}^{m} I_{p,x_k} I_{s,x_l} \right) \quad [34]$$

$$c_{0,y}^{(q,r)} = 2[\Omega_{00}^{(q,r)}]^{m-1} \sum_{k=1}^{3} \Omega_{0k}^{(q,r)} I_{x_k} - \frac{1}{2}(m-1)(m-2)$$

$$8 \sum_{k,l,p=1}^{3} \Omega_{0k}^{(q,r)} \Omega_{0l}^{(q,r)} \Omega_{0p}^{(q,r)} I_{1,x_k} I_{2,x_l} I_{3,x_p} \quad \text{for } m=1,2,3.$$

The density operator resulting from the initial state $2S_y I_{x_j}$, with $$I_{x_j} = \sum_{i=1}^{m} I_{i,x_j},$$

is obtained from $Z_j$ in Eq. [31] as $$\rho_j(t) = Im[S^+\Sigma(m,x_j,+1)]. \quad [35]$$

From Eq. [30] defining $\Sigma(m,x_j,q)$, there is a factor $U_{(+1)} 2I_{i,x_j} U_{(-1)}^\dagger$ given by row j of TABLE 1 for a single I spin, multiplied by $U_{(+1)} U_{(-1)}^\dagger$ for the remaining m−1 spins. This process is repeated for each I spin contained in the sum over the individual spins, and the final result must be imaginary. Compared to row zero of TABLE 1, the elements which are either pure real or pure imaginary in rows 1–3 are interchanged, so the solutions for $\rho_j(t)$ can be taken from the $\rho_0(t)$ results by adding all combinations in Eq. [34] that replace a single element from row zero with one from row j. The coefficients of the $S_x$ and $S_y$ operators can then be written in general form for this case as $$c_{j,x}^{(q,r)} = m\Omega_{j0}^{(q,r)}(\Omega_{00}^{(q,r)})^{m-1} - \quad [36]$$

$$\frac{m-1}{2^{m-2}} \times 4 \sum_{k,l=1}^{3} [(m-2)\Omega_{j0}^{(q,r)} \Omega_{0k}^{(q,r)} \Omega_{0l}^{(q,r)} + (\Omega_{00}^{(q,r)})^{m-2}$$

$$(\Omega_{jk}^{(q,r)} \Omega_{0l}^{(q,r)} + \Omega_{0k}^{(q,r)} \Omega_{jl}^{(q,r)})] \times \left[ \sum_{p=1}^{m-1} \sum_{s>p}^{m} I_{p,x_k} I_{s,x_l} \right]$$

$$c_{j,y}^{(q,r)} = 2 \sum_{k=1}^{3} [(\Omega_{00}^{(q,r)})^{m-1} \Omega_{jk}^{(q,r)} + (m-1)(\Omega_{00}^{(q,r)})^{m-2} \Omega_{j0}^{(q,r)} \Omega_{0k}^{(q,r)}] I_{x_k} -$$

$$\frac{1}{2}(m-1)(m-2) \times 8$$

$$\sum_{k,l,p=1}^{3} (\Omega_{jk}^{(q,r)} \Omega_{0l}^{(q,r)} \Omega_{0p}^{(q,r)} + \Omega_{0k}^{(q,r)} \Omega_{jl}^{(q,r)} \Omega_{0p}^{(q,r)} + \Omega_{0k}^{(q,r)} \Omega_{0l}^{(q,r)} \Omega_{jp}^{(q,r)})$$

$$I_{1,x_k} I_{2,x_l} I_{3,x_p}$$

so that, combining these results, $$\rho_v(t) = c_{v,x}^{(1,-1)} S_x + c_{v,y}^{(1,-1)} S_y \quad [37]$$

for an $I_mS$ system starting with the initial conditions denoted by v=0, . . . ,3 of Eq. [17]. The expressions given in Eqs. [34] and [36] for the coefficients show explicitly which I-spin operators contribute as the number, m, of I spins increases.

Multiple S-Spins. For n>1, terms of the form $S_i \Pi_j P_j$ in Eq. [31] result in the same products of S-spin operators as for the $IS_n$ case. Noting that the terms involving components of the total I-spin operator for m I spins are included in the expressions for $c_{v,x}$ and $c_{v,y}$ derived above, we can immediately write from Eq. [26]

$$\rho_v(t) = \quad [38]$$

$$\frac{1}{2^{n-1}} \sum_{i=1}^{n} \left\{ S_{i,x} \left\{ f_1^n(c_{v,x}) + 2 \sum_{j \neq i}^{n} S_{j,z} \left[ f_2^n(c_{v,x}) + 2 \sum_{\substack{k>j \\ k \neq i}}^{n} S_{k,z} f_3^n(c_{v,x}) \right] \right\} + \right.$$

$$\left. 2S_{i,y} \left\{ f_1^n(c_{v,y}) + 2 \sum_{j \neq i}^{n} S_{j,z} \left[ f_2^n(c_{v,y}) + 2 \sum_{\substack{k>j \\ k \neq i}}^{n} S_{k,z} f_3^n(c_{v,y}) \right] \right\} \right\},$$

using the functions $f_i^n$ from TABLE 3. Variations in the scalar couplings are handled as for the $IS_n$ case, with an additional modification of $\omega_{q_s}$ for each I spin, leading to separate versions of TABLE 4 labeled by the I spin and corresponding modifications of Eqs. [34] and [36].

Longitudinal S Spinstates

The following provide analytical solutions for the irradiation of the I spins and the evolution of the I-spin magnetization and associated spinstates, involving only longitudinal $S_z$, that were not considered in the foregoing. The formalism shows immediately that these can be viewed as classical rotations about effective fields that incorporate the coupling, which allows the solutions to be written down by inspection. (In the subsequent reduction of theory to practice, we switch the spin-labelling convention to irradiation of the S spins for spinstates involving only longitudinal $I_z$ for these classical rotations.)

$IS_n$ Systems

The propagator is still given by Eq. [15], and we consider the set of $si_{x_j}$ initial states $$\rho(t_0) \in \{I_{x_j}, 2I_{x_j}S_z\}. \qquad [39]$$

As for the initial conditions listed in Eq. [17] of the previous section, the members of this set only evolve, for an IS system, to members within the set. The time development of the system is given by $$\rho(t) = U(t, t_0)\rho(t_0)U^\dagger(t, t_0) = \sum_{q_1,\ldots,q_n=\pm 1} U_{q_s}\rho(t_0)U_{q_s}^\dagger \prod_{j=1}^n P_k^{q_j}, \qquad [40]$$

which follows from $P_k^\pm P_k^\mp = 0$ and $P_k^\pm(2S_z) = P_k^\pm$. The sums and products that appear in Eq. [40] are parsed in the discussion surrounding Eq. [11]. Thus, the solution for the density operator again reduces to calculating products of the form $U_q I_{x_j} U_r^\dagger$, similar to Eq. [22], and we could proceed with the expansion in terms of the Pauli basis as in the previous section. However, Eq. [22] was obtained for initial states involving transverse S-spin operators, which, in turn, forced $r=q-2$. This mixing of propagators associated with different allowed values for the magnetic quantum number of the total S-spin angular momentum has no classical analogue. In the present case, where $r=q$, each term of the form $U_q I_{x_j} U_q^\dagger$ in Eq. [40] can be immediately recognized as the transformation that generates a classical rotation of each component of the quantum-mechanical vector operator I about $\omega_q$, and the solutions can be obtained by inspection using standard matrix results for a 3D rotation about an arbitrary axis. The desired rotation matrix $R_q$ is listed in TABLE 5 in terms of the RF phase angle $\phi$, the polar angle $\theta_q$ given in Eq. [8], and rotation angle $\beta_q$ of Eq. [12]. The rotated I-spin components are then multiplied by the specified products of the projection operators $P_k^\pm = 1/2E_k \pm S_{kz}$.

For n=1, there are product operator terms involving both no S-spins and a single $S_z$, so that $$2I_{x_j} \to [R_{(+1)}+R_{(-1)}]I_{x_j}+[R_{(+1)}-R_{(-1)}]2I_{x_j}S_z(n=1), \qquad [41]$$

where the rotations $R_{(\pm 1)}$ act only on the I-spin operator. For n=2, there are rotations $\{R_{(\pm 2)}, R_{(0)}\}$ and an additional product $S_{1z}S_{2z}$, which, for n=3, expands to include $S_{1z}S_{3z}$ and $S_{2z}S_{3z}$ plus a term involving three S-spins, $S_{1z}S_{2z}S_{3z}$ together with rotations $\{R_{(\pm 3)}, R_{(\pm 1)}\}$ acting on the given I-spin operator. The functions $g_v^n(R)$ of the specific rotation matrices which give the coefficients of these operators are tabulated in TABLE 6, where (as for the functions $f_i^n$) the superscript n is the number of S-spins in the system and the subscript v=0, . . . ,n gives the number of S-spins in the particular product operator term. The results, again, are of similar structure to Eq. [26], and we obtain, for $\rho_j(t_0)=I_{x_j}$, $$\rho_j(t) = \frac{1}{2^n}\left(g_0^n(R) + 2\sum_{i=1}^n S_{i,z}\right.$$
$$\left.\left\{g_1^n(R) + 2\sum_{k>i}^n S_{k,z}\left[g_2^n(R) + 2\sum_{l>k}^n S_{l,z}g_3^n(R)\right]\right\}\right)I_{x_j} \qquad [42]$$

This equation can be used for the initial state $2I_{x_j}S_z$ by multiplying all $R_{(0)}$, $R_{(-1)}$, and $R_{(-1)}$ in TABLE 6 by minus one, which follows from the relation $2P_j^\pm S_{j,z}=\pm P_j^\pm$ that arises in the derivation.

$I_m S_n$ Systems

For isotropic J-coupling, additional I-spins produce no effect other than increasing the initial polarization of I. The subspace propagators $U_{(q)}$ in Eq. [13] become a product composed of individual propagators for each I-spin, as in Eq. [28], and the previous rotations become rotations of the total I-spin for each component $$I_{x_j} = \sum_{i=1}^m I_{i,x_j}.$$

Different scalar couplings $J_{IS}$ merely result in separate rotations of individual I-spin components determined by each $U_{i(q)}$.

Reduction of Theory to Practice

Single S Spin

It is well known that the torque on a magnetization vector of a single spin, subject to continuous RF irradiation of constant amplitude and phase, is constant and proportional to the effective field, $B_e$, where $B_e$ is the resultant of the RF field, $B_1$, and the resonance offset, $\Delta H$ (Hz). Defining $B_1$ as the reciprocal 360° pulse time on resonance $$B_e^2 = B_1^2 + \Delta H^2, \qquad [43]$$

or equivalently, as pictured in FIG. 1, the tilt angle, $\alpha$, of the effective field relative to the xy plane of the rotating reference frame is defined as $$\sin \alpha = \Delta H/B_e, \text{ or } \cos \alpha = B_1/B_e. \qquad [44]$$

On resonance, the magnetization will rotate around the RF field by an angle $$\theta = 2\pi B_1 t, \qquad [45]$$

where t is the length of time the RF is applied and off resonance the rotation is increased to $$\theta = 2\pi B_e t. \qquad [46]$$

An arbitrary rotation can be described in terms of a 3×3 rotation matrix to calculate the final orthogonal components of the S magnetization, $S_j$, from the initial components, $S_j^0$:

$$\begin{bmatrix} S_x \\ S_y \\ S_z \end{bmatrix} = \begin{bmatrix} f_{xx} & f_{xy} & f_{xz} \\ f_{yx} & f_{yy} & f_{yz} \\ f_{zx} & f_{zy} & f_{zz} \end{bmatrix} \begin{bmatrix} S_x^o \\ S_y^o \\ S_z^o \end{bmatrix},$$ [47]

which in terms of linear combinations is $$S_i = \sum_j f_{ij} S_j^o,$$ [48]

where i and j take the values x, y, z. The axis of rotation is the direction of $B_e$, and in addition to the tilt, $\alpha$, the direction of this axis in 3D space is also determined by the phase of the RF energy. In NMR, the phase of the applied RF irradiation is commonly x, y, -x, or -y (i.e. 0°, -90°, -180, or -270°), but any phase angle, $\beta$, relative to zero phase along the x axis can be used. This phase angle is also depicted in FIG. 1.

Beginning with the simple 3×3 matrices for rotations about the x, y and z axes, Bendall and Pegg (Magnetic Resonance in Medicine 2, 91 (1985); Journal of Magnetic Resonance 63, 494 (1985)) showed with basic mechanics that the matrix for a pulse of angle $\theta'$ about an axis which is rotated a phase angle $\beta$ from the x axis and is tilted upwards by an angle $\alpha$ from the xy plane as in FIG. 1, is $$f(\theta'[\beta], \alpha) =$$ [49]

$$\begin{bmatrix} f_A \cos^2\beta + f_D \sin^2\beta & f_B - f_G \sin 2\beta & f_C \cos\beta + f_E \sin\beta \\ -f_B - f_G \sin 2\beta & f_A \sin^2\beta + f_D \cos^2\beta & -f_C \sin\beta + f_E \cos\beta \\ f_C \cos\beta - f_E \sin\beta & -f_C \sin\beta - f_E \cos\beta & f_F \end{bmatrix},$$

where $$f_A = \cos^2\alpha + \sin^2\alpha \cos\theta',$$ [50]

$$f_B = \sin\alpha \sin\theta',$$ [51]

$$f_C = \sin 2\alpha \sin^2(\theta'/2),$$ [52]

$$f_D = \cos\theta',$$ [53]

$$f_E = \cos\alpha \sin\theta',$$ [54]

$$f_F = \sin^2\alpha + \cos^2\alpha \cos\theta',$$ [55]

and $$f_G = \cos^2\alpha \sin^2(\theta'/2) = (f_A - f_D)/2.$$ [56]

The sign convention used in the following in this disclosure is that clockwise rotations are positive and the x axis is clockwise of the y axis as in FIG. 1. Changing the sign of either of these changes the sign of all sine terms and thus all $\sin\beta$ and $\sin 2\beta$ terms in matrix [49] as well as the sign of $f_c$ and $f_E$. The rotation of a magnetization vector, $S_y$ initially along the z axis (i. e. initially $S_z^o$), around $B_e$ is illustrated in FIG. 1 along with the resolution of this unit vector into its orthogonal components, $S_x$, $S_y$, and $S_z$. The orthogonality of these components ensures, via the Pythagorus theorem, that their root-sum-of-squares is the S vector of unit magnitude.

For RF of x phase ($\beta=0$), $$f(\theta'[x], \alpha) = \begin{bmatrix} f_A & f_B & f_C \\ -f_B & f_D & f_E \\ f_C & -f_E & f_F \end{bmatrix}.$$ [57]

In the absence of an RF field, $B_e = \Delta H$, and all the terms in [57] are zero except $f_F = 1$, $f_A = f_D = \cos[2\pi\Delta Ht_D]$ and $f_B = \sin[2\pi\Delta Ht_D]$, which expresses the interchange of $S_x$ and $S_y$ magnetization via chemical-shift precession during time delay $t_D$.

Phase cycling a single rectangular pulse can be analyzed by changing $\beta$ to $\beta \pm n*90°$ in matrix [49], and summing or subtracting the corresponding $f_{ij}$ terms in the resulting matrices depending on the sign of the receiver phase. This eliminates some of the $f_{ij}$ terms in the final 3×3 matrix and thus some orthogonal components of magnetization, and demonstrates how the results of pulse sequences can be changed by phase cycling single pulses—examples are given by M. R. Bendall and D. T. Pegg, Magnetic Resonance in Medicine 2, 91 (1985); Journal of Magnetic Resonance 63, 494 (1985); 66, 546 (1986). Most instances of the use of pulsed field gradients in NMR methods eliminates particular $f_{ij}$ terms and thus mimics or replaces the use of phase cycling for this purpose. Consequently, these applications of pulsed gradients can be analyzed quantitatively in the same way as phase cycling.

By digitizing shaped pulses into small time increments, each having constant attributes of amplitude and phase, matrix [49] can be used to calculate the time course and result of any frequency/amplitude modulated pulse (since phase is the integral of frequency) by repetitive matrix multiplication. But the result of multiplying 3×3 matrices is a 3×3 rotation matrix, so the magnetization of a spin at a particular resonance offset has undergone an overall single rotation about some axis in 3D space and the logic concerning phase cycling applies to the overall complex pulse. Thus, for example, if the $f_{xy}$ term is eliminated for a rectangular pulse by phase alternation, it will also be eliminated for the complex pulse. These straightforward algorithms also apply to the 4×4 and 6×6 J-rotation matrices developed below.

Matrix [49] is a general analytical solution to the Bloch equations, neglecting relaxation—the only input from quantum mechanics is that there is an initial Boltzmann distribution producing a net magnetization. These analytical solutions for a single spin, derived from basic mechanics, must also be found in the foregoing QM derivation, and the corresponding QM solutions are listed in TABLE 5. Substituting for the different angle symbols shows that the nine terms in TABLE 5 are identical to those in matrix [49]. Thus, the effect of RF irradiation on a single spin can be determined from basic mechanics as a classical rotation around the effective field $B_e$. Expressing a general rotation in terms of a rotation matrix (e.g. [49]) directly provides the magnitude of the three possible orthogonal PO spinstates, $S_x$, $S_y$ and $S_z$.

Classical Is-Spin Rotations

The first step in any pulse sequence applied to a coupled IS spin system is the excitation of the S spins prior to any RF on the I spins. The foregoing QM analysis shows that this irradiation involves exchange between the six spinstates, $S_x$, $S_y$, $S_z$, $2S_xI_z$, $2S_yI_z$, and $2S_zI_z$, and indicates that these can be viewed as classical rotations. In the following it is shown that a 6×6 rotation matrix can be derived from 3×3 rotation matrix [49] using classical principles and that an exact vector model is applicable.

The basis of this classical vector model is that one half of the S spins, $S^+$, are coupled to I spins aligned with the $+z$ axis (and rotate around an effective field $B_e^+$), and the other half, denoted by $S^-$, are coupled to I spins aligned with the $-z$ axis (and rotate around $B_e^-$). This is the only additional input from quantum mechanics. The magnitudes of these effective fields are $$(B_e^\pm)^2 = B_1^2 + [\Delta H \pm (J/2)]^2, \qquad [58]$$

the tilt angles are $$\sin \alpha^\pm = [\Delta H \pm (J/2)]/B_e^\pm, \text{ or } \cos \alpha^\pm = B_1/B_e^\pm. \qquad [59]$$

and the rotation angles are given by $$\theta^\pm = 2\pi B_e^\pm t, \qquad [60]$$

in parallel with Eqs. [43] to [46]. On resonance, the magnitude of $B_e^+$ and $B_e^-$ are identical, so $B_e^\pm = B_e^{J-[B_1^2+(J/2)^2]^{0.5}}$ will be used.

An on-resonance $S_z$ to $2S_xI_z$ conversion is shown in FIG. 2a to 2c to illustrate the two effective fields, $B_e^+$ and $B_e^-$, two of the possible spinstates, and the rotation of $S^+$ and $S^-$ around $B_e^+$ and $B_e^-$, respectively. The clockwise rotation of $S^-$ about $B_e^-$ is displayed more readily in FIG. 2b as an anticlockwise rotation around $-B_e^-$. Matrix [49] can be applied to the individual rotations of $S^+$ and $S^-$, and the magnitudes of the $si_{x_j}$ spinstates are determined by noting that in FIG. 2a, $S_z$ is the sum of $S_z^+$ (the component of $S^+$ along z) and $S_z^-$, whereas in FIG. 2c, the antiparallel state, $2S_xI_z$, is given by $S_x^+$ minus $S_x^-$. Thus, scaling all vectors relative to unit positive magnitude, the orthogonal spinstates are given by $$S_i = 0.5(S_i^+ + S_i^-) \qquad [61]$$

and $$2S_iI_z = 0.5(S_i^+ - S_i^-), \qquad [62]$$

where i takes the values x, y, z as usual.

Accordingly, the terms in the 6×6 matrices for the interconversion of the six spinstates can be written down by inspection since they are given by the sums and differences of the terms in the 3×3 matrices, [49] or [57], for rotations around $B_e^+$ and $B_e^-$. In general, listing the spinstates in the order, $S_x$, $S_y$, $S_z$, $2S_xI_z$, $2S_yI_z$, and $2S_zI_z$, the 6×6 matrices will be $$f(\theta^\pm[\beta], \alpha^\pm) = 0.5 * \begin{bmatrix} \text{SUM of 3×3} & \text{DIFFERENCE of 3×3} \\ \text{matrix terms} & \text{matrix terms} \\ \\ \text{DIFFERENCE} & \text{SUM} \end{bmatrix}, \qquad [63]$$

where the diagonally opposite quadrants are identical. For example, defining $f^\pm$ as the appropriate member of Eqs. [50] to [56] with arguments $\alpha^\pm$ and $\theta^\pm$, the top-left term for the most general case resulting from matrix [49] is $(f_A^+ + f_A^-)\cos^2\beta + (f_D^+ + f_D^-)\sin^2\beta$, which simplifies to $f_A^+ + f_A^-$ for the 6×6 matrix resulting from Eq. [57] for RF of a single phase x:

$$2.0*f(\theta^\pm[x], \alpha^\pm) = \begin{bmatrix} f_A^+ + f_A^- & f_B^+ + f_B^- & f_C^+ + f_C^- & f_A^+ - f_A^- & f_B^+ - f_B^- & f_C^+ - f_C^- \\ -f_B^+ - f_B^- & f_D^+ + f_D^- & f_E^+ + f_E^- & -f_B^+ + f_B^- & f_D^+ - f_D^- & f_E^+ - f_E^- \\ f_C^+ + f_C^- & -f_E^+ - f_E^- & f_F^+ + f_F^- & f_C^+ - f_C^- & -f_E^+ + f_E^- & f_F^+ - f_F^- \\ f_A^+ - f_A^- & f_B^+ - f_B^- & f_C^+ - f_C^- & f_A^+ + f_A^- & f_B^+ + f_B^- & f_C^+ + f_C^- \\ -f_B^+ + f_B^- & f_D^+ - f_D^- & f_E^+ - f_E^- & -f_B^+ - f_B^- & f_D^+ + f_D^- & f_E^+ + f_E^- \\ f_C^+ - f_C^- & -f_E^+ + f_E^- & f_F^+ - f_F^- & f_C^+ + f_C^- & -f_E^+ - f_E^- & f_F^+ + f_F^- \end{bmatrix}, \qquad [64]$$

The six spinstates are orthogonal and thus the root-sum-of-squares of the terms in the rows or columns of any of the 6×6 matrices derived as for matrix [64] must be unity in the same sense that the Pythagorus theorem applies to the 3D components of a single vector via the 3×3 rotation matrix as in FIG. 1. That is, beginning with a spinstate of unit magnitude, the total of the spinstates or vector sum must always be unity at any time independent of the complexity of the RF pulse applied.

The corresponding rotation matrices for more than one coupled I spin can also be written down by inspection and the number of coupled S spins does not affect the progress of these classical rotations. For example, for an $I_3S_n$ group the total S spin magnetization splits into four components rotating around four effective fields which are the resultants of $B_1$, offset, and coupling fields $\pm J/2$ and $\pm 3J/2$. In the forgoing QM analysis it was assumed that the I spins rather than the S spins were irradiated during classical $I_mS_n$ rotations. With this change of labels, analytical terms for these various rotation matrices can be written down from TABLE 6, giving, for example, exactly the same analytical expressions as those in matrix [64].

Bazzo and Boyd in the Journal of Magnetic Resonance 79, 568 (1988) undertook a limited QM analysis to obtain the exchange between the six spinstates, $S_x$, $S_y$, $S_z$, $2S_xI_z$, $2S_yI_z$, and $2S_zI_z$, via coupling during selective pulses on the S spins in an IS system and summarized their analytical formulae in a 6×6 matrix identical to matrix [64] except for a different sign convention. However, neither Bazzo and Boyd, nor any other authors, have determined the most general analytical expressions obtainable from matrix [49], nor did these or any other authors consider $I_mS_n$ systems, or research exact analytical expressions for any nonclassical rotations, or consider the total set of 225 possible analytical expressions required to determine all 15 PO spinstates for an IS system after arbitrary RF irradiation of one type of spin.

Off resonance the rotations of $S^+$ and $S^-$ are unequal, occurring about effective fields of different magnitude which are not symmetrically tilted with respect to the xy plane as they are in FIG. 2a. For large frequency offsets or for large $B_1$, the difference between $B_e^+$ and $B_e^-$ approaches zero, $S^+$ and $S^-$ follow identical paths, and J can be ignored. When J=0, or when $B_1$ or $\Delta H$ is large, the top right and bottom left quadrants of matrix [64] are all zeros and the other two quadrants reduce to 3×3 matrix [57]. There is no exchange of magnetization between $S_i$ and $2S_iI_z$—this is the normal high power approximation. If $B_1$=5J, failure to include $\pm J/2$ in $B_e^\pm$ produces an error of 0.5% in $B_e^\pm$ on resonance and a maximum error of 5% at about 10J off resonance. Thus, the high power approximation is good for classical rotations for $B_1 > 5J$.

On resonance at lower power, $B_e^\pm = B_e^J$, $\alpha^+ = -\alpha^- = \alpha$, so equation [64] reduces to $$f(\theta'[x], \alpha) = \begin{bmatrix} f_A & 0 & 0 & 0 & f_B & f_C \\ 0 & f_D & f_E & -f_B & 0 & 0 \\ 0 & -f_E & f_F & f_c & 0 & 0 \\ 0 & f_B & f_C & f_A & 0 & 0 \\ -f_B & 0 & 0 & 0 & f_D & f_E \\ f_C & 0 & 0 & 0 & -f_E & f_F \end{bmatrix}, \quad [65]$$

with $\theta' = 2\pi B_e^J t$. When both $B_1$ and $\Delta H$ are zero, all the terms in the 6×6 matrices are zeros except $f_A = f_D = \cos[\pi J t_D]$ and $f_B = \sin[\pi J t_D]$, which corresponds to free J-coupled precession interconverting $S_x \leftrightarrows 2S_yI_z$, and $S_y \leftrightarrows 2S_xI_z$ during delay $t_D$. As noted for 3×3 rotation matrices, the elimination of some orthogonal spinstates by phase cycling can be analyzed by adding or subtracting 6×6 matrices for RF of different phase, and the results will be true for single rectangular pulses or shaped pulses simulated by repetitive matrix multiplication.

The theoretical basis of all previous studies concerning excitation pulses are exactly explicable in terms of small subsets of the analytical expressions contained in matrix [64], and the Selective Population Transfer method (Chalmers, Pachler and Wessels, Journal of Magnetic Resonance, 15, 415 (1974); Jakobsen, Kanyha and Brey, Journal of Magnetic Resonance, 54, 134 (1983); Bildsoe, Journal of Magnetic Resonance, 27, 393 (1977); and references contained therein) is an example. As another example, the $f_c$ term in the third column of matrix [65] corresponds to the on-resonance transformation of $S_z$ to $2S_xI_z$ discovered by Brondeau and Canet (Journal of Magnetic Resonance 47, 419 (1982)), and illustrated in FIG. 2a to 2c. From Eq. [52], the transformation occurs in 100% yield when $B_1$=J/2 ($\sin 2\alpha=1$) and the rotation is 180° for a pulse length of $t=(2^{0.5}j)^{-1}$. The $f_c$ term in the fourth column of Eq. [65] determines the inverse transformation, $2S_xI_z \to S_z$, not previously described. The $f_c$ terms in the first and last columns of matrix [65] reveal the new transformations, $S_x \leftrightarrows 2S_zI_z$, and the forward conversion is illustrated in FIG. 2d leading to FIG. 2e.

The time course of the spinstate transformations in FIG. 2 clearly demonstrate the contribution from J coupling during the pulse, a contribution which arises from the angle between $B_e^+$ and $B_e^-$. We will call the above matrices that include the effect of J modulation, "J-rotation matrices", and we have named the corresponding RF pulses, "J pulses", or more specifically 180ʲ or 90ʲ depending on the extent of the ideal rotation on resonance—the 90ʲ variety arises from nonclassical rotations as described in the following. These 180ʲ or 90ʲ pulses are frequency selective and in the following we will also show that either a selective 90ʲ or a selective 180ʲ pulse of any frequency bandwidth can take the place of any combination of any hard 90° pulse and a consecutive $(2J)^{-1}$ free precession delay in any IS pulse sequence.

Vector Representations of Is-Spin Experiments

The results of any NMR experiment are observed by detecting rotating nuclear magnetization vectors in the sample. These vectors evolve during an NMR pulse sequence and this evolution could be followed by stopping the pulse sequence at any point in its time course and measuring the magnetizations present at that point in time. For the purpose of establishing the various embodiments of the invention we introduce a specific definition of the measurability of the state of an NMR system: A state is measurable if maximum detectable signal can be observed directly, or is observable after a hard on-resonance pulse on the S spins and/or on the I spins.

Within this definition, all pure orthogonal IS spinstates, and any mix of these spinstates, are measurable. Furthermore, the $I^+$, $I^-$, $S^+$ and $S^-$ vectors comprising each spinstate are measurable. For example, the $2S_xI_z$ state (FIG. 2c) is measured as directly-observable antiphase $S^+$ and $S^-$ signal at +J/2 and −J/2 respectively, whose magnitude sums to unity, compared to in-phase signal at ±J/2 of total unit magnitude for $S_x$. The same applies to $2S_yI_z$ and $S_y$ except for a phase shift of 90°. In contrast, potentially-observable $S_z$ and $2S_zI_z$ (FIG. 2e) may be measured by applying a hard 90[S] pulse in the first case to detect in-phase signal, or either a 90[S] or 90[I] pulse in the second case to observe the antiphase S signal or the antiphase I signal respectively. (These hard 90° pulses must lie well within the high power approximation discussed above in relation to matrix [64] and in the following in relation to Eqs. [86] and [87]). Similarly, antiphase I signal from $2S_xI_z$ and $2S_yI_z$ are measurable after a 90[S] pulse of y or x phase, respectively, and a 90[I] pulse of any phase. The transverse spinstates, e.g. $2S_yI_x$ as in FIG. 2f, can be measured by a hard 90° pulse of appropriate phase on one spin and observation of the antiphase signal from the other spin.

Mixed spinstates, as in FIG. 2b, are the vector sums of individual spinstates. These, and in particular the resultant magnetization vectors $S^+$ and $S^-$, can be measured using fractional hard pulses of incremented phase. Assuming no knowledge of the prior experiment, two signals at ±J/2 will be initially detected. Then, concentrating on the signal at +J/2, both the pulse angle and phase of a hard S pulse at +J/2 could be varied by trial-and-error until pulse angle, $\phi$, phase, $\varphi$, gives a maximum signal ($S^+$ transverse) and pulse angle, 90—$\phi$, phase, 180—$\varphi$, gives zero signal ($S^+$ along z). The 3D orientation of $S^+$ is then known unambiguously, and the procedure could be repeated at −J/2 to determine $S^-$. For arbitrary conditions, the experimentally-measured orientations of $S^+$ and $S^-$ can be resolved into the six possible spinstates, or the QM or vector calculation of the spinstates can be summed to determine $S^+$ and $S^-$. Thus there is a straightforward match between quantum mechanics, the vector model of FIG. 1 and FIG. 2, and what is measurable.

However, the vector model illustrated in FIG. 2 ignores what is measurable in terms of any I-spin magnetization vectors. This question is resolved as in FIG. 3 for the simple experiment of free J-coupled precession for a total time of $(2J)^{-1}$ (corresponding to column one of matrix [65] when both $B_1$ and $\Delta H$ are zero ($f_c$=0)). At time zero, FIG. 3a, directly after a 90[S,−y] pulse (90° pulse on the S spins of −y phase), the spinstate is pure $S_x$ and no I signal can be detected after application of a 90[S, x];90[I] pulse pair.

Accordingly, there are no I-spin vectors along ±z. Part way through the evolution as in FIG. 3b, the I-spin vectors have grown in proportion to $-\sin\pi Jt$ ($=-\sin\gamma$ in FIG. 3b) reaching unit magnitude when $S^+$ and $S^-$ are antiphase along ±y. Accordingly, experimental measurement of the antiphase I signal after 90[S, x];90[I] returns a total intensity of $-\sin\pi Jt$ in accordance with the transformation of $S_x$ to $-2S_yI_z$ given by the $-\sin\pi Jt$ term in matrix [65] when both $B_1$ and $\Delta H$ are zero. Addition of the evolving nature of the detectable I-spin magnetization, depicted in FIG. 3, to the vector model of FIG. 2, provides an exact correspondence with all aspects of the 6×6 J-rotation matrices. The measurable I-spin signal (the magnitude of $I^+$ plus $I^-$) is the vector sum (root-sum-of-squares) of all the antiphase $2S_iI_z$ (i=x, y, and z) states, whereas the total S-spin signal (the magnitude of $S^+$ plus $S^-$) is the vector sum of all six states. Stating this in alternate form, $S^+$ and $S^-$ are of constant amplitude, whereas $I^+$ and $I^-$ vary as sine of half the angle subtended by $S^+$ and $S^-$. The orientation of $S^+$, for example, is given by the vector sum of the $S^+$ portions of each pure PO spinstate, and the orientation and magnitude of $I^+$ is obtainable from the vector sum of the $I^+$ parts of all the pure antiparallel states. Thus the experimental result of any S-spin irradiation is determined by the 3D orientation and magnitude of $S^+$, $S^-$, $I^+$ and $I^-$ and these attributes are predictable from the 6×6 J-rotation matrix.

The resulting pictorial vector model unambiguously illustrates the evolution of the measurable I-spin vectors. The addition of this I-spin evolution (as depicted in FIG. 3) to vector diagrams for classical S-spin rotations (as exemplified in FIG. 2b and 2d), provides an exact correspondence with all aspects of the 6×6 J-rotation matrices and completes the vector model of classical rotations. In the following, nonclassical IS-spin rotations that interchange four orthogonal spinstates are addressed. We have been unable to deduce the associated analytical equations on the basis of linear vector rotations. However, the general rule (and its subrules) that the measurable I and S-spin vectors correspond to the vector sum of the four PO states holds true, and provides a minimal but adequate representation. Although the resulting vector descriptions are not readily predictive in all cases, because they depend on non-linear rates of rotation, they are nevertheless helpful in many circumstances.

Thus, in terms of an IS spin-half system, the logical steps that establish the rigor of graphical (vector) representations of nuclear spin magnetizations are:

The result of any NMR experiment is detected via the oscillating electric currents induced in a coil by rotating macroscopic nuclear magnetic fields (magnetizations) in the sample;

Calculations using the QM density matrix for any time point in an NMR pulse sequence must exactly predict these observable magnetizations;

The same QM calculations, or equivalently our explicit equations that are general solutions of the density matrix, also determine the proportions of all the PO states existing at any time point in a sequence;

The four individual magnetization vectors that comprise a pure PO state (two are of zero magnitude for an in-phase PO state) can be measured directly (i.e. observed), or they can be measured after application of hard 90° pulses;

For mixed spinstates, the vector sums of these four individual vectors provide the total measurable magnetizations under all conditions and at any time.

A picture of the rotation and fluctuating magnitude of these vectors in 3D space throughout a pulse sequence provides a rigorous description of the NMR experiment.

The universality claimed for such vector descriptions is justified by the finding that all previous studies on an IS spin system are subsumed within the overall picture, including previous vector models (e.g. Pegg, Bendall and Doddrell, Journal of Magnetic Resonance, 44, 238 (1981); Bendall, Pegg and Doddrell, Journal of Magnetic Resonance, 45, 8 (1981); Bendall, Journal of Magnetic Resonance, A 116, 46 (1995); Skinner and Bendall, Journal of Magnetic Resonance, 134, 315 (1998); and the common form of the PO formalism (Sorensen, Eich, Levitt, Bodenhausen and Ernst, Progress in NMR Spectroscopy, 16, 163 (1983)).

Important embodiments of the invention utilize the finding that these vectors are literal or real in all circumstances: They can be calculated from QM or measured by experiment. This finding is valid for the classical rotations described in the foregoing, and the nonclassical rotations discussed in the following.

Nonclassical Is-Spin Rotations

The foregoing discussion provides the theoretical basis of the invention and describes known classical rotations of nuclear spin magnetizations, plus some new classical rotations that can be discovered from the general theoretical analysis presented here. In this disclosure we further show that nonclassical rotations are induced for both spins in a coupled IS spin system when the I spin is irradiated after excitation of the S spin. This contrasts with the classical rotations describable in terms of 3×3 rotation matrices, or 6×6 J-rotation matrices. Some of the embodiments of the invention arise from determining the exact behaviour of the I and S spins during these purely quantum-mechanical nonclassical evolutions.

In an IS-spin system, when the I-spin is irradiated after excitation of the S spin, the foregoing exact QM analysis shows that such an NMR experiment interchanges four orthogonal spinstates. From TABLES 1 to 4 an explicit 4×4 J-rotation matrix can be written for these interconversions. Listing the spinstates in the order $S_x$, $2S_yI_x$, $2S_yI_y$, and $2S_yI_z$, the most general matrix is given by $f(\theta^{\pm}[\beta],\alpha^{\pm})=$ $$f(\theta^{\pm}[\beta], \alpha^{\pm}) = 0.5 * \begin{bmatrix} f_1 & f_2\cos\beta + f_3\sin\beta & f_2\sin\beta - f_3\cos\beta & f_4 \\ -f_2\cos\beta + f_3\sin\beta & f_5 + f_6\cos2\beta & f_6\sin2\beta + f_7 & f_8\cos\beta - f_9\sin\beta \\ -f_2\sin\beta - f_3\cos\beta & f_6\sin2\beta - f_7 & f_5 - f_6\cos2\beta & f_8\sin\beta + f_9\cos\beta \\ -f_4 & f_8\cos\beta + f_9\sin\beta & f_8\sin\beta - f_9\cos\beta & f_{10} \end{bmatrix}, \quad [66]$$

which, for an RF pulse of x phase, simplifies to $$f(\theta^{\pm}[x], \alpha^{\pm}) = 0.5 * \begin{bmatrix} f_1 & f_2 & -f_3 & f_4 \\ -f_2 & f_5 + f_6 & f_7 & f_8 \\ -f_3 & -f_7 & f_5 - f_6 & f_9 \\ -f_4 & f_8 & -f_9 & f_{10} \end{bmatrix}, \quad [67]$$

where $$f_1 = (1+\cos[\alpha^+ - \alpha^-])\cos 0.5[\theta^+ - \theta^-] + (1-\cos[\alpha^+ - \alpha^-])\cos 0.5[\theta^+ + \theta^-],$$ [68]

$$f_2 = (\cos\alpha^+ + \cos\alpha^-)\sin 0.5[\theta^+ - \theta^-] + (\cos\alpha^+ - \cos\alpha^-)\sin 0.5[\theta^+ + \theta^-],$$ [69]

$$f_3 = \sin[\alpha^+ - \alpha^-](\cos 0.5[\theta^+ - \theta^-] - \cos 0.5[\theta^+ + \theta^-]),$$ [70]

$$f_4 = (\sin\alpha^+ + \sin\alpha^-)\sin 0.5[\theta^+ - \theta^-] + (\sin\alpha^+ - \sin\alpha^-)\sin 0.5[\theta^+ + \theta^-],$$ [71]

$$f_5 = (1-\sin\alpha^+\sin\alpha^-)\cos 0.5[\theta^+ - \theta^-] + (1+\sin\alpha^+\sin\alpha^-)\cos 0.5[\theta^+ + \theta^-],$$ [72]

$$f_6 = \cos\alpha^+\cos\alpha^-(\cos 0.5[\theta^+ - \theta^-] - \cos 0.5[\theta^+ + \theta^-]),$$ [73]

$$f_7 = (\sin\alpha^+ - \sin\alpha^-)\sin 0.5[\theta^+ - \theta^-] + (\sin\alpha^+ + \sin\alpha^-)\sin 0.5[\theta^+ + \theta^-],$$ [74]

$$f_8 = \sin[\alpha^+ + \alpha^-](\cos 0.5[\theta^+ - \theta^-] - \cos 0.5[\theta^+ + \theta^-]),$$ [75]

$$f_9 = (\cos\alpha^+ - \cos\alpha^-)\sin 0.5[\theta^+ - \theta^-] + (\cos\alpha^+ + \cos\alpha^-)\sin 0.5[\theta^+ + \theta^-],$$ [76]

$$f_{10} = (1-\cos[\alpha^+ + \alpha^-])\cos 0.5[\theta^+ - \theta^-] + (1+\cos[\alpha^+ + \alpha^-])\cos 0.5[\theta^+ + \theta^-],$$ [77]

and $\sin\alpha^\pm$, $\cos\alpha^\pm$, and $\theta^\pm$ are defined in Eqs. [58] to [60]. On resonance, $\theta^+ = \theta^- = \theta'$, $\alpha^- = -\alpha^+ = -\alpha$, so the 4×4 matrix reduces to $$f(\theta'[x], \alpha) = \begin{bmatrix} f_A & 0 & -f_C & f_B \\ 0 & 1 & 0 & 0 \\ -f_C & 0 & f_F & f_E \\ -f_B & 0 & -f_E & f_D \end{bmatrix},$$ [78]

where the terms are given by Eqs. [50] to [55] and $\theta' = 2\pi B_e t$ in which $B_e = B_e^\pm = B_e^J$ as for the discussion following Eqs. [58] to [60]. The angle $\alpha$ is analogous to the residual on-resonance tilt of the effective field shown in FIG. 2 for classical rotations, arising from the $\pm J/2$ coupling fields, although, as described in the following, no classical rotations can be found around these individual tilted $B_e^\pm$ fields.

In the absence of an RF field, J-rotation matrix [78] reduces to $$f(t) = \begin{bmatrix} \cos[\pi J t] & 0 & 0 & \sin[\pi J t] \\ 0 & 1 & 0 & 0 \\ 0 & 0 & 1 & 0 \\ -\sin[\pi J t] & 0 & 0 & \cos[\pi J t] \end{bmatrix}.$$ [79]

Columns one and four describe free J-coupled precession interconverting $S_x \leftrightarrows 2S_y I_z$, whereas columns two and three correspond to the well known invariance of the transverse antiparallel $2S_y I_x$ and $2S_y I_y$ spinstates during time delays (Bendall, Pegg, and Doddren, Journal of Magnetic Resonance, 46, 43 (1982); 52, 81 (1983)).

For large $B_1$, the high power limit, or large $\Delta H$, matrix [67] reduces to $$f(\theta'[x], \alpha) = \begin{bmatrix} 1 & 0 & 0 & 0 \\ 0 & f_A & f_B & f_C \\ 0 & -f_B & f_D & f_E \\ 0 & f_C & -f_E & f_F \end{bmatrix},$$ [80]

where J has been eliminated as insignificant and $B_e$ in $\theta' = 2\pi B_e t$ is given by Eq. [43].

For the nonclassical rotations induced by RF on the I-spins, governed by the 4×4 matrices [66], [67] and [78], a simple predictive vector model as in FIG. 2 is not possible, but the orientation and magnitude of $S^+$, $S^-$, $I^+$ and $I^-$, may still be calculated in agreement with experiment and a reasonably simple vector description results, especially for ideal conditions such as on-resonance irradiation.

Such a vector description is shown for an ideal case in FIG. 4a to 4c for initial $S_x$, $B_1 = J/2$, and RF of x phase applied on resonance to the I spins for a time of $(2^{0.5} J)^{-1}$. In this case the $S^+$ and $S^-$ vectors precess 90° in the xy plane during the same time that the $I^+$ and $I^-$ vectors rotate from the z axis to the y axis. The rotation of the S-spin vectors results entirely from J coupling, whereas the rotation of the I-spin vectors is a combination of J and RF modulation. In consequence we will refer to this new kind of pulse as a "90$^J$" pulse. The axis of rotation of the I spins is the x axis. It is not tilted as it was for the classical rotations depicted in FIG. 2 and this can be proven by experimental measurement or from the observation that there is no $2S_y I_x$ magnetization indicated in matrix [78] since the rotation lies entirely in the zy plane. Neither of the rotation angles shown in FIG. 4a, $\gamma$ or $\phi$, evolve linearly with time since $\cos\gamma = f_A$ and $\cos\phi = f_B$. The 100% transformation of $S_x$ to $2S_y I_z$ via some intermediate $2S_y I_z$ described in FIG. 4a to 4c, is given by the terms in the first column of matrix [78] when $B_1 = J/2$, and the reverse transformation corresponds to the third column. The more complex formation of some $2S_y I_x$ off resonance is given by the non-zero $f_2$ term in matrix [67].

In accordance with our literal view of magnetization vectors, detailed experimental information concerning the precession of the $S^+$ and $S^-$ vectors was obtained from analyzing the S signals at $\pm J/2$ throughout the 90$^J$ pulse using the sequence, 90[S,−y]; a*90$^J$[I,x]; acquire S, [A]

where 90[S,−y] signifies a 90° pulse of −y phase on the S spins. The parameter a was varied from 0 to 2 so that the nominal 90$^J$ pulse was varied from zero length to twice its calibrated length. The total signal as a function of this pulse length may be resolved into in-phase components along x, i.e. $S_x = 0.5(S_x^+ + S_x^-)$, and antiphase signal along y, i.e. $0.5(S_y^+ - S_y^-)$ as in FIG. 5. The latter can only be $2S_y I_z$ since $2S_y I_y$ is not directly observable. From the data in FIG. 5a and 5b, $$S_x = \cos^2[\pi B_e^J t] = 0.5(1+\cos[2\pi B_e^J t]),$$ [81]

in agreement with Eq. [68] for $B_1 = J/2$ and $\Delta H = 0$, and $$2S_y I_z = (2^{0.5}/2)\sin[2\pi B_e^J t].$$ [82]

For these experiments, $I = {}^{13}C$, $S = {}^1H$ and J=222 Hz, and spectra were obtained using a standard HCN triple-resonance PFG probe on a 500-MHz Varian INOVA spectrometer using a 2% sample of the isopropyl ester of $H^{13}CO_2H$ in $CDCl_3$, doped with 0.2% $Cr(AcAc)_3$ relaxation agent. In the spirit of our literal view of magnetizations, the $2S_y I_y$ state can be measured by adding a hard 90° pulse on S or I to convert the spinstate to $2S_y I_z$ or $2I_y S_z$ as in 90[S,−y]; a*90$^J$[I,x]; 90[I,±x]; acquire S[±], [B]

or

90[S,−y]; a*90$^J$[I,x]; 90[S,±x]; acquire I[±], [C]

respectively, where the phase alternations ensure elimination of undesired spinstates. The experiment in FIG. 5c for sequence [B], with the spin labels swapped to $S = {}^{13}C$ and $I = {}^1H$, showed that $$2S_y I_y = \sin^2[\pi B_e^J t],$$ [83]

and the same experimental result was obtained from sequence [C] with $I = {}^{13}C$ and $S = {}^1H$. Eqs. [82] and [83] agree with the $f_B$ and $f_C$ terms of the first column in matrix [78] when $B_1=J/2$ (signs not determined experimentally) as further confirmation of the QM analysis and the vector description.

The FIG. 4 vector description of a $90^I$ pulse corresponds to the evolution of vectors in real space, since the orientation and magnitude of the $S^+$, $S^-$, $I^+$ and $I^-$ magnetizations can be measured experimentally. With the experimental proof provided in Eqs. [81] to [83], vector descriptions of I-spin irradiation under less ideal conditions, or beginning with any of the other three spinstates, can be obtained with confidence directly from matrices [66], [67] or [78].

For example, on-resonance vector descriptions for continuous RF of any amplitude applied to initial $S_x$ can also be obtained from the first-column terms of matrix [78]. For all values of $B_1$, $S^+/S^-$ always reverse midway through each cycle, depicted in FIG. 4c, 4d and 4e, to refocus to pure $S_x$ when the rotation of $I^+/I^-$ is 180° at $\theta'=360°$. The cycle begins again from FIG. 4a. Although $I^+/I^-$ terminate along the ∓z axes but originate along ±z, this transition at the end of each cycle is not discontinuous because $I^+/I^-$ are of zero magnitude at this time. For $B_1>J/2$, $S^+/S^-$ do not reach the ∓y axes by the time $I^+/I^-$ are transverse —the system is a mixture of $S_x$ and $-2S_yI_y$, so $I^+/I^-$ are less than unit magnitude, as shown in FIG. 4d. For very large $B_1$, the precession of $S^+/S^-$ during the RF reduces to zero and, at the midpoint of the rotation, $I^+/I^+$ are vanishingly small (the high power approximation). For $B_1<J/2$, $S^+/S^-$ have precessed past the ∓y axes at the midpoint of each cycle as in FIG. 4e, and again $I^+/I^+$ are less than unit magnitude because the system is a mixture of $-S_x$ and $-2S_yI_y$. The $S^+/S^-$ vectors never precess as far as the $-x$ axis before reversing their motion, except in the limit of $B_1 \to 0$ in which case the vector motion becomes continuous free precession. Pure $-2S_yI_y$ is only produced for the specific case of $B_1=J/2$.

From the terms in matrix [67], or from the relationship between the system Hamiltonian and the density operator introduced in the foregoing QM theory, it can be shown that $$d\{S_x\}/dt=\pi J\{2S_yI_z\}. \qquad [84]$$

In terms of the angles defined in FIG. 4 this equation yields $$d\gamma/dt=\pi J \cos\phi. \qquad [85]$$

Analogous equations to [84], and hence Eq. [85], can be obtained from the evolution of any of the other three PO spinstates, or any linear combination of all four spinstates. In consequence it is proven from Eq. [85] that, under all conditions for nonclassical rotations, the instantaneous coupling constant acting on the S spins is $J \cos \phi$. This is a central tenet of the semiclassical vector model, introduced by Bendall, Journal of Magnetic Resonance, A 116, 46 (1995) and Skinner and Bendall, Journal of Magnetic Resonance, 134, 315 (1998), which model was postulated as being accurate for RF field strengths corresponding to $B_e \gg J$. A detailed comparison of the exact expressions in matrix [67] with the corresponding approximate expressions given by this semiclassical model shows that the model is accurate to better than 5% for $B_e > 5J$. Thus, this semiclassical model is subsumed within the exact set of analytical expressions as already noted in the foregoing.

For nonclassical rotations, the $I^+$ and $I^-$ vectors remain antiparallel under all conditions, otherwise more than four spinstates would be generated, but their motions are much more complex during off-resonance irradiation than during on-resonance RF. Simulations using the first column of matrix [67] for initial $S_x$ indicate that during CW irradiation the $I^+$ and $I^-$ pair rotate around an axis whose orientation also varies with time producing spiral trajectories. For large offsets such that $B_e = B_e^{\pm} \gg J$, $I^+$ and $I^-$ spiral from ±z and become spin-locked to the effective field $B_e$ soon after application of the CW irradiation and the picture reduces to our previous semiclassical vector model discussed in the preceding paragraph, so that for $B_e > 5J$ a simple accurate predictive vector model does exist. However, in general it is impossible to draw a predictive model for off-resonance irradiation when $B_1 \approx J/2$ and simulations using matrix [67] are necessary. In all cases at low $B_1$, on and off resonance, the measurable I-spin magnetizations do not rotate around constant effective fields and this negative property is independent of the initial spinstate. For classical IS rotations, individual terms in the 6×6 matrices are either sums or differences of terms for single vector rotations, e.g. $\sin \alpha^+ \sin \theta^+ \pm \sin \alpha^- \sin \theta^-$. In comparison, the individual nonclassical terms such as $f_4$ in Eq. [71] are both sums and differences, and the rotation angle arguments, $\theta^+$ and $\theta^-$, are added and subtracted instead of the trigonometric terms. This is the mathematical expression of the entanglement of the I and S spins that provides the complexity of the spin physics off resonance. The collapse of $0.5[\theta^+ - \theta^-]$ to zero and $0.5[\theta^+ + \theta^-]$ to $\theta'$ on resonance, yielding 4×4 matrix [78], permits the simple vector picture of FIG. 4 and generates the same trigonometric functions as in the 6×6 matrix [65] for on resonance conditions. At least in part, these parallels ensure that there are 100% spinstate transformations for nonclassical rotations, such as $S_x \leftrightarrows 2S_yI_y$, analogous to the classical conversions described in the foregoing.

Thus, despite fundamental differences, the orthogonality of the four spinstates for nonclassical transformations ensures there are some properties in common with classical rotations. A general rule of conservation of magnetization applies to unitary transformations and so, beginning with unit magnetization, the vector sum of all the spinstates is unity. Consequently, the sums-of-squares of the terms in each row or column of matrices [66], [67], [78], [79] and [80] is unity just as for the 3×3 and 6×6 matrices governing classic rotations. Magnetization does not disappear into forbidden QM space but is conserved. Thus, for nonclassical rotations, the I-spin signal (magnitude of $I^+$ plus $I^-$) is the vector sum (root-sum-of-squares) of the antiparallel $2S_yI_i$ (i=x, y, and z) states, and the total S-spin signal (magnitude of $S^+$ plus $S^-$) is the vector sum of all spinstates, as for classical rotations. Similarly, the alternate rules that $S^+$ and $S^-$ are of constant amplitude, and $I^+$ and $I^-$ vary as sine of half the angle subtended by $S^+$ and $S^-$, apply. The property of orthogonality also ensures that phase cycling, to eliminate signal from some spinstates, can be analyzed by adding or subtracting the corresponding terms in matrices for each phase in the same manner as for classical rotations.

The foregoing mathematical and diagrammatic description of these nonclassical quantum-mechanical rotations is both new and not obvious to those practiced in the art. For example Levitt, Bodenhausen and Ernst (Journal of Magnetic Resonance, 53, 443 (1983)) made a detailed analysis of the "illusions of spin decoupling" by searching for indications of I-spin perturbations on the S-spin magnetization during decoupling, but did not discover the foregoing effects. Indeed, Levitt et al determined (equation [58] in the above-cited reference, but using our nomenclature and sign convention) that beginning with the $2S_yI_z$ spinstate under the influence of on-resonance CW decoupling, the total signal oscillates between the $2S_yI_y$ and $2S_yI_z$ states as $$\sin[2\pi B_1 t]\{2S_yI_y\}+\cos[2\pi B_1 t]\{2S_yI_z\}. \qquad [86]$$

From the fourth column of matrix [78], the exact result is $$(J/[2B_e])\sin[2\pi B_e t]\{S_x\}+(B_1/B_e)\sin[2\pi B_1 t]\{2S_y I_y\}+\cos[2\pi B_1 t]\{2S_y I_z\}. \quad [87]$$

Equation [87] reduces to [86] when $B_1 \gg J$, so clearly equation [86] is the high power approximation (consistent with matrix [80] on resonance), which eliminates the transfer of magnetization between the antiparallel $2S_y I_j$ states and the in-phase state, $S_x$, that occurs at lower power. The study of Levitt et al still determines current thinking in this area even though the high power approximation is accurate to better than 5% only for RF field strengths corresponding to $B_1 > 50J$. This can be compared with the high power approximation for classical rotations that is valid above the much lower limit of $B_1 > 5J$.

General Rapid Calculations of Nuclear Spin Evolution Throughout Pulse Sequences

The first embodiment of the invention includes the general use of 4×4 J-rotation matrices to determine the evolution of the nuclear spin magnetizations after each time increment throughout an NMR pulse sequence. These matrices can be used to determine the outcome of any pulse sequence element in which the I spins are pulsed whilst the S spins are transverse, or by swapping the labels, any pulse sequence element can be modeled for which the S spins are pulsed whilst the I spins are transverse. As noted in the foregoing, this includes any time delays when no RF is applied. Any phase-cycled pulse (or equivalent pulsed field gradient) can be mimicked by summing or subtracting the matrices. Any amplitude and/or frequency modulated RF pulse can be assessed by repeated application of the 4×4 J-rotation matrices for each time increment that has constant amplitude and phase. In addition, if the 6×6 matrices are included for any pulse on the S spins when the I spins are longitudinal, or any pulse on the I spins when the S spins are longitudinal, a comprehensive method is generated. The application of these matrices may be automated with computer software requiring no intervention from the user except to input the attributes of the RF pulse sequence. Such software may be programmed to output the magnitude of all possible spinstates continuously at each time increment throughout the sequence. Alternatively, the evolution of the nuclear magnetizations which can be measured, designated $S^+$, $S^-$, $I^+$ and $I^-$ in the foregoing, can be displayed as a vector diagram, continuously throughout the pulse sequence in a similar fashion to the example in FIG. 4. This detailed numerical or pictorial feedback is of obvious value in the display, design and optimization of NMR methods.

In the foregoing it was noted that for a coupled IS spin system there are 15 possible spinstates. The QM theory and its reduction to practice showed that for irradiation of one type of spin the interconversions between these spinstates can be grouped as being either classical or nonclassical. Classical rotations interchange 6 spinstates and the analytical terms comprise a 6×6 rotation matrix, whereas nonclassical rotations involve 4 spinstates given by a 4×4 rotation matrix. There is no overlap between the subsets of 6 and 4 spinstates applicable for irradiation of one of the spins. For example, when irradiating S a classical rotation occurs beginning with any initial combination of $S_x$, $S_y$, $2S_x I_z$, and $2S_y I_z$ (i.e., states with no transverse I-spin magnetization), and can only interchange the proportions of these 6 spinstates. Alternatively, nonclassical rotations for S-spin irradiation occur for either $I_x$, $2S_z I_y$, $2S_y I_y$, and $2S_x I_y$, or for the subset $I_y$, $2S_z I_x$, $2S_y I_x$, and $2S_x I_x$. Together with initial $I_z$, these total the 15 possible spinstates. The total number of analytical expressions contained within the 6×6 and two 4×4 matrices is 68 compared to a total of 15×15=225 analytical expressions for all interconversions between spinstates in an IS system. The term for $I_z \leftrightharpoons I_z$ is unity when irradiating S and the remainder of the 225−69=156 terms (e.g., for $S_x \leftrightharpoons 2S_z I_y$) are all zeros because it is not possible to interconvert a spinstate in a classical subset with one in a nonclassical subset. The most efficient general means of calculation will thus employ only the subsets of 6×6 or 4×4 equations. These subsets of the 225 equations are illustrated diagrammatically in FIG. 6, a 15×15 matrix which includes the 6×6 and 4×4 matrices as subsets. The 68 terms which are not 0 or 1 are designated by +signs in FIG. 6.

For irradiation of I instead of S, three new groupings of the 15 spinstates are applicable, obtained by swapping the I and S labels in the subset lists in the preceding paragraph, and so the subsets of 6×6 or 4×4 equations still apply. If only the magnitude of one spinstate is required, this can be computed with even greater efficiency using 2×2 matrices of analytical expressions as explained in the foregoing discussion of the QM theory.

There are several existing computer programs that automate the application of the PO formalism to pulse sequences. These implement the common form of the PO formalism in which all RF pulses are treated as instantaneous (Shriver, Journal of Magnetic Resononance 94, 612 (1991); Kanters, Char and Addison, Journal of Magnetic Resononance A 101, 23 (1993)). But the treatment of RF pulses as being essentially instantaneous corresponds to the high power approximation and thus any effect of coupling during the pulse is ignored. Thus, paradoxically, this common formalism, assumed by many to be rigorous, is not exact.

However, as already noted in the foregoing, repeated use of the QM density matrix for each time increment (having constant RF attributes) during a pulse sequence provides exact results and can be used for any RF method. But, the major problem with utilizing the density matrix is that it is a very slow method. For a system of N coupled spins, numerical density-matrix calculations require diagonalization and multiplication of $2^N \times 2^N$ matrices. These operations are often cited as requiring on the order of $(2^N)^3$ floating-point-operations (flops). This considerably underestimates the computational load of calculations involving complex numbers, as in the present case, since complex multiplication requires 6 flops (two multiplications and an addition for both the real and imaginary parts) compared to 1 flop for multiplication of two real numbers. By contrast, the number of operations for each time increment in a pulse sequence using the analytical equations described in this disclosure scales linearly with the number of spins.

To obtain a more precise comparison between our analytical solutions and standard density-matrix methods, we programmed the necessary calculations using Matlab software (The Mathworks, www.mathworks.com.), which has a function for monitoring the number of flops. This number was calculated for a single time increment of arbitrary attributes for a nonclassical rotation and the results are:

| Spin system | Density matrix | Analytical | Density-matrix/Analytical Ratio |
|---|---|---|---|
| IS | 9525 | 200 | 48 |
| IS$_2$ | 66224 | 382 | 173 |
| IS$_3$ | 476267 | 570 | 835 |

The gains in efficiency using our analytical equations are very large in comparison to a density matrix calculation, and these gains increase dramatically with the number of spins in the system. Furthermore, this list of results probably underestimates the total gain because the density matrix calculation was programmed to calculate only $S_x$ whereas the anaytical equations were used to exactly determine all possible spinstates. Note also that the number of flops in the foregoing table for the numerical density matrix approach assumed that it was only necessary to calculate the result for those spinstates involving transverse I-spin magnetization when irradiating S. For an IS spin system, for example, this assumes that all analytical expressions other than the two 4×4 matrices and the 6×6 matrix are known to be zero (or unity). But these other 225−69=156 terms are analytical expressions derived in the foregoing QM theory and not obvious to those practiced in the art. An uninformed numerical density matrix calculation must calculate all 15 IS spinstates and thus be much slower than indicated by the foregoing table.

The source of these efficiency gains is easy to identify. The slow numerical methods solve the density matrix for each time increment in the pulse sequence, and thus repeat this operation a large number of times for each pulse sequence. In contrast, we have already labored to solve the density matrix to obtain concise analytical equations, and so we do not need to repeat this slow step ever again.

Characterizations of RF Probes

A second embodiment of the invention comprises methods for the calibration of RF frequencies, powers and homogeneities.

The detailed study of CW decoupling by Anderson and Freeman (Journal of Chemical Physics 37, 85 (1962)) provided a solution for the amplitude and frequency of the decoupled S-spin signal during RF irradiataion of the I spins starting with pure in-phase magnetization, $S_x$, of the observed nucleus. The earliest calibration methods of the decoupling I-spin irradiation (Ernst, Journal of Chemical Physics 45, 3845 (1966); Pachler, Journal of Magnetic Resonance 7, 442 (1972)) are derived from this solution. They measure the residual splitting of the centerband signal from incomplete decoupling off resonance and use this to calculate the intensity of the RF field applied to the unobserved nucleus. This residual splitting of the centerband is equal to $\theta^+ - \theta^-$ ($=2\pi B_e^+ - 2\pi B_e^-$), from the first term in equation [68] (row one, column one of matrix [67]). The residual splitting vanishes on resonance, reducing to the term, $f_A$, in matrix [78]. Denoting the effective field on resonance as $$B_e^J = [B_1^2 + (J/2)^2]^{0.5},$$

this term, given by Eq. [50], is $$f_A = (B_1/B_e^J)^2 + (J/2B_e^J)^2 \cos[2\pi B_e^J t] \quad [88]$$

and this indicates a means of measuring both RF field strength and homogeneity. The FT (Fourier transform) of a FID (free induction decay) given by Eq. [88] will yield a centerband with amplitude, $1-(J/2B_e^J)^2$, and sidebands at $\pm B_e^J$ with amplitude, $0.5(J/2B_e^J)^2$. $B_1$ can be determined from the frequency difference between these sidebands by rearranging the expression for $B_e^J$, and the width of the sidebands depends on RF homogeneity.

In this disclosure we provide examples of the S/N (signal to noise) gain in calibrating an insensitive I-spin channel (e.g. $^{13}$C) via a sensitive S-spin channel (e.g. $^1$H). This is relevant to the present day area of the $^1$H spectroscopy of $^{13}$C-labelled compounds (e.g. labelled proteins and nucleic acids). The invention includes within its scope the use of the sidebands generated on resonance to measure the homogeneity of the RF source, and the application of decoupling to antiparallel magnetization to yield more intense sidebands that in turn can be used to calibrate both the RF power and the RF homogeneity.

Comparison of the second terms of Eqs. [68] and [88] indicates that the sidebands in question have greater S/N for on-resonance decoupling. An even more significant gain can be obtained by applying decoupling to antiparallel spinstates since a comparison of Eq. [88] and the equivalent equation generated from Eq. [52] (row one, column three of matrix [78]) shows that the equivalent sidebands from $2S_yI_y$ are larger than those originating from $S_x$ for all $B_1 > J/2$. Furthermore, our experimental results, described below (FIG. 7), demonstrate that the sidebands from $2S_yI_y$ are sufficiently large for realistic values of $B_1 < J/2$ that they can be used to calibrate $B_1$ over a very broad range of values. Alternatively, the sidebands resulting from decoupling $2S_yI_z$, given by equation [51] (row one, column four of matrix [78]), may be utilized if necessary because these are larger than those from $2S_yI_y$ for $B_1 \leq J/2$.

The $2S_yI_y$ spinstate can be prepared in various ways, e.g. by the pulse sequence elements, $90[S]-(2J)^{-1}-90[I]$, but a more direct selective means can be synthesised using the $S_x$ to $2S_yI_y$ transformation as described in the foregoing and illustrated in FIG. 4. Thus when the CW irradiation is applied on resonance with amplitude $B_1 = J/2$ for a discrete time, $t = 1/(2B_e^J) = 1/(2^{0.5}J)$, $S_x$ is completely transformed to $2S_yI_y$. As mentioned in the foregoing, we will denote this discrete irradiation as a $90^J$ pulse.

In consequence we identify a family of Characterization-Of-Decoupler pulse sequences which we will call COD sequences:

$90[S, -y]; \{obs[S], CW[I]\},$ [COD1]

$90[S, -y]; 90^J[I, +-]; \{obs[S, +-], CW[I]\},$ [COD2]

$90[S, -y]; 90^J[I, +-]; 90[I]; \{obs[S, +-], CW[I]\},$ [COD3]

$90[S, -y]; 90^J[I, +-]; 90[S, ++--x]; \{obs[I, +--+], CW[S]\}$ [COD4]

$90[S, ++--y]; 90J[I, +-]; \{obs[I, +--+], CW[S]\}.$ [COD5]

All pulses and decoupling irradiation are on resonance and are of x phase unless specified. The notation, $\{obs[S], CW[I]\}$, signifies detection of the S spins whilst CW decoupling the I spins. The ± signs in COD2 and COD3 indicate concurrent alternation of pulse and receiver phase to eliminate all magnetization except $2S_yI_y$. The extra $90[I]$ pulse in COD3 converts $2S_yI_y$ to $2S_yI_z$. Alternatively, COD4 and COD5 are the S-spin equivalents of COD3 and COD2, respectively, and can be used for characterization of the S-spin channel via decoupling $2I_yS_z$ and $2I_yS_y$, respectively. Note the 90° phase shift for the initial 90[S] pulses (typical of polarization transfer sequences) and a four-phase cycle is preferable as written.

COD1 is not novel and it is used in association with the invention to obtain approximate initial calibrations for the $90^I$ pulse and the I frequency. The I frequency is determined to be on resonance when the residual splitting of the centerband is minimized, and $B_1=J/2$ for the $90^I$ pulse when the the sidebands at $\pm B_e^J$ are at $\pm J/2^{0.5}$. These calibrations are not critical since the frequency and amplitude for the $90^I$ pulse need only be accurate to $\pm 20$ Hz and $\pm 1$ dB, respectively, to obtain more than 90% of optimum signal intensity when using COD2 and COD3.

If a more accurate value of the I-spin centerband frequency is required, it can be set on resonance to within 0.1 Hz or better using COD2, and this is illustrated in FIG. 7. In FIG. 7, the large centerband signal obtained from applying low-power CW decoupling to $2S_yI_y$ coherence using the COD2 pulse sequence (I≡$^{13}$C, S≡$^1$H) is plotted as a function of frequency offset in 0.1 Hz intervals ($B_1=95$ Hz, corresponding to an attenuator setting of 10 dB in FIG. 8). The centerband is maximized on resonance, providing fast and precise calibration for the frequency of the I-spin channel via better S/N from the S spins. Potentially, the precision of this measurement increases with decreasing CW power because the envelope of the decoupled S-spin peak, plotted in FIG. 7, covers a smaller frequency range as a result of increased residual splitting at a given offset as $B_1$ decreases. However, the maximum centerband amplitude rapidly decreases for $B_1<J/2$, which limits the ultimate precision obtainable. By contrast, frequency calibrations obtained by direct detection of $S_x$ using COD1 are not as accurate, because COD1 provides an asymmetric distribution of centerband amplitude resulting from the overlap of one line of the symmetric off-resonance doublet with the small isotopically-shifted resonance from $^{12}$C-formate—this provides a distribution which could also be mistakenly attributed to more than one frequency generated by the spectrometer's synthesiser. This is a first example of the value of the selective nature of COD2 and COD3 (which also makes the $B_e^J$ sidebands easy to observe even when they are very weak). Provided peak shapes are symmetric (good magnetic field homogeneity), studies of the kind shown in FIG. 7 also confirm that the second-channel frequency synthesiser is providing a single narrowband frequency. (Experimental data for FIGS. 7 to 10 were obtained on a Varian INOVA-600 spectrometer, equipped with a 5-mm HCN triple-resonance PFG probe, using a 4% sample of $^{13}$C(99.5%)-formate (J=194.6 Hz) in D$_2$O containing a trace of gadolinium chloride to provide a $^1$H line width of 3.5 Hz at 30° C.).

COD2 provides large inverted satellite signals at $\pm B_e^J$ relative to the centerband when low-power CW decoupling is applied on-resonance to $2S_yI_y$ coherence. Measurement of the separation of these sidebands provides a direct calibration of $B_1$ as demonstrated in FIG. 8, where RF fields calculated from the relation, $B_1=[(B_e^J)^2-(J/2)^2]^{0.5}$, are plotted as a function of the spectrometer's coarse RF attenuator over a range of 55 dB in 1 dB increments. The lines at $\pm B_e^J$ are broadened by RF inhomogeneity, as discussed in more detail for FIG. 9. The frequency of the sidebands was determined as the midpoint of the top third of the broadened peaks to correspond to the dominant sensitive volume in the sample. COD3 yields identical RF power data but has better S/N for $B_1 \leq J/2$. The accuracy of the new techniques for calibrating low power RF pulses applied to insensitive nuclei is also demonstrated in FIG. 8 in comparison with results from the traditional pulsed 180°/null method that can only be used at high power. These values are plotted as filled triangles, partially overlapping the points obtained from the CW decoupling method. The results in FIG. 8 also illustrate that this sideband technique can be used to determine whether the spectrometer's attenuators, amplifiers and probe are indeed linear.

The frequency distribution of the $B_e^J$ satellite lines produced in a simple 1D acquisition by any of the COD sequences can be used to quickly observe the homogeneity of the I-spin irradiation during on-resonance CW decoupling, since the frequency depends on $B_1$ amplitude. The average power level of the decoupling field should be high enough so that RF inhomogeneity dominates magnetic field inhomogeneity, but not so high as to produce poor S/N in the $B_e^J$ lines. Again, care must be taken for COD1 that the sidebands do not overlap other small resonances, whereas COD2 and COD3 have the advantages of being selective and giving better S/N for the satellite lines. Typical spectra are plotted in FIG. 9a for COD1; 9b for COD1 with a 180[S, $\pm x \pm y$] pulse prior to signal acquisition and receiver phase alternated as ++−−; and 9c for COD2. Sideband signal intensity begins at $\pm J/2$ relative to zero centerband frequency and extends to the left and right as given by $B_e^J=(B_1^2+(J/2)^2)^{0.5}$, where $B_1$ is the spatially-variable (inhomogeneous) RF field of the CW I-spin irradiation in the sample. The $B_1$ scale derived from this relation, applicable to all three spectra, is provided in FIG. 9c.

An anomalous probe having two dominant $B_1$ values for the $^{13}$C coil, as illustrated by the dip at the top of the sideband peaks, was chosen for this disclosure to more clearly demonstrate RF inhomogeneity. The lines are further broadened in the direction of decreasing frequency showing a distribution of $B_1$ in the sample down to small values. A spectral width of 1000 Hz is displayed, with $B_1=270$ Hz for the I-spin CW irradiation (corresponding to an attenuator setting of 19 dB in FIG. 8). The COD2 spectrum in FIG. 9c has been inverted relative to COD1 in 9a and 9b.

Differences in the spectra in FIG. 9 for offsets just outside $\pm J/2$ can be attributed to differences in the signal amplitude response from the sample arising from the pulse sequences that were used. The amplitude response from each sample voxel depends on the spatially-inhomogeneous pulse angle, θ, applied to the S spins in each voxel. This amplitude response is proportional to θ sin θ for COD1 in FIG. 9a and θ sin$^3$ θ for COD1 with an added phase-cycled 180[S] pulse as in 9b (see Bendall and Gordon, Journal of Magnetic Resonance 53, 365 (1983)). In regions of the sample where $B_1$ is small enough that $B_e^J$ is only a little larger than J/2, sideband amplitudes for COD2 are further reduced by the fraction of $S_x$ converted to $2S_yI_y$ via the sin$^2$ φ expression in Eq. [52], where $\phi=\theta'/2=\pi B_e^J t$. The amplitude response for COD2 is therefore equal to θ sin θ sin$^2$ φ, which accounts for the differences between the sidebands in FIG. 9a and 9b. The addition of the 180[S] pulse illustrates another principle: The 90[S] pulse in the COD sequences can be replaced by a pulse sequence of any length that produces $S_x$, thus enabling an estimation of the effect of I-spin RF inhomogeneity on any pulse sequence. As shown for the sequence in FIG. 9b, the sample amplitude response is modified by an additional trigonometric term for each pulse (Bendall and D. T. Pegg, Journal of Magnetic Resonance 57, 337 (1984); Magnetic Resonance in Medicine 2, 91 (1985); 2, 298 (1985). Thus this 1D method, as illustrated in FIG. 9, provides a quick means of comparing different pulse sequences, different NMR probes and different probe manufacturers.

Uncertainties in the interpretation of the 1D spectra arising from the θ sin θ S-spin signal response from each sample point can be eliminated by obtaining 2D images of the spatial signal response via insertion of incremented phase-encoding pulsed field gradients after the 90[S] pulse in any of COD1 to COD3. The $B_e^J$ frequency axis obtained from the FT of each FID along the $t_2$ dimension can be converted to $B_1$, which is the desired RF amplitude from the probe, and the $t_1$ dimension provides the distance axis. Thus, the $\theta \sin^2 \theta \sin^2 \phi$ signal variation for COD2 becomes a S/N contour plot. 2D images of sideband signal intensity as a function of frequency, $B_e^J$, and of distance along the z-axis of a 5 mm diameter sample, were obtained by inserting z-axis phase-encoding gradients in COD pulse sequences and results are shown in FIG. 10. The $B_e^J$ axis was converted to RF amplitude using $B_1=[(B_e^J)^2-(J/2)^2]^{0.5}$. A partial selection of signal contours are displayed in FIG. 10a and these were obtained for a $^{13}C$ coil using COD2 ($^{13}C$ CW irradiation corresponding to an attenuator setting of 25 dB in FIG. 8) with a phase-encoding gradient inserted after the 90[S] pulse. Identical contours were obtained using COD2 or COD3 to detect the large $^1H$ signals from antiparallel spinstates. The ellipsoidal central contour surrounds a region of lower signal intensity (shaded), which is revealed as the RF anomaly that produced the dip in the peaks of FIG. 9. Projecting the sum of the contours onto the RF axis gives the 1D spectrum of one of the sidebands, and thus the dip anomaly in the peaks in FIG. 9 also corresponds to these two dominant $B_1$ values. This anomaly could correspond to either an asymmetric or a concentric variation of $B_1$ across the sample's center and that can be determined by adding a second phase-encoding gradient along the x or y axis of the sample. Such a 3D study should allow the probe manufacturer to correlate the anomaly with an aspect of the probe design so that in future the simple 1D COD2 method of FIG. 9 could be used by the manufacturer or a customer to ensure quality control.

Unlike the coil demonstrated in FIG. 10a, for ideal probes producing single values of $B_1$ for each sample cross-section along the z axis, signal intensity, and thus the S/N contours, provide no additional information, since $B_1$ is given by the $t_2$ dimension. Results can then be displayed as simpler line plots (or RF profiles) using either the average $B_1$ across the contours, or $B_1$ for the contour of maximum S/N as in FIG. 10a to 10c, at each point in the sample. FIG. 10b shows an RF profile obtained for a $^1H$ coil using COD4 with a z-axis phase-encoding gradient on the I spin ($^{13}C$) inserted just prior to signal acquisition; FIG. 10c provides results for the same $^1H$ coil using an incremented excitation pulse to provide the $B_1$ dimension and a read gradient to give the spatial dimension in the 2D image, as according to Talagala and Gillen (Journal of Magnetic Resonance 94, 493 (1991)). In the case of the sensitive $^1H$ coil, the incremented pulse method is faster than COD4 and is provided here to confirm the accuracy of the new techniques. However, in contrast, COD2 or COD3 provide vastly superior results for the insensitive $^{13}C$ coil. When applied to the $^{13}C$ coil, the alternative lower S/N incremented-pulse method (results not shown) only vaguely showed the coil's $B_1$ anomaly after a four-hour experiment, compared to ten minutes for 2D COD2 or COD3, or a few seconds for 1D COD2/COD3.

Frequency-Selective RF Pulses

Frequency-selective RF pulses may be used to simplify complex spectra by selecting a subset of resonances. In multi-dimensional NMR they may be used to reduce the bandwidth of one or more dimensions to increase resolution for the same total acquisition time. Alternatively, they can eliminate one dimension to allow increased resolution in the remaining dimensions for the same acquisition time, or to reduce the total experimental time. In 1D applications, such as in in vivo NMR, the object is to select a reduced number of desired resonances from a complex overlapping array of signals. Frequency-selective NMR is of increasing potential worth with increasing molecular weight as an aid in discrimination between more numerous signals, but selective pulses are not commonly used at present because they are long and there is loss of S/N via relaxation for large molecules. The methods described in the following replace existing delays within pulses sequences with selective pulses and so do not greatly increase the time length of the sequence.

This third embodiment of the invention utilizes J modulation during an RF pulse to selectively and completely transform a weakly-coupled IS spin system between single-spin magnetization and two-spin product operator states, or vice versa. In the conventional use of frequency-selective pulses, the effects of scalar coupling are suppressed by decoupling or spin-locking the unselected spins during selective 90° pulses, or by the refocusing that occurs naturally during selective inversion pulses. By taking advantage of J-coupled motion during the RF irradiation we show that any consecutive combination of a 90° pulse and a $(2J)^{-1}$ free precession period in any pulse sequence may be replaced by a single frequency-selective pulse, and we will refer to this new class of RF pulse as "J pulses". Thus, J pulses are not distinguished from other selective pulses by shape, but by the precise match of pulse time $t_p$ and $B_1$ amplitude necessary to provide an exact transformation between two spin-states that would conventionally require a combination of a pulse and delay period for the conversion.

In the foregoing discussion of classical rotations we identified examples of $180^J$ pulses, and for nonclassical rotations a $90^J$ pulse was discovered. In summary, there are at least three potentially useful J pulses:

$$180^J[S, x] \text{ for } S_z \Leftrightarrow 2S_xI_z, \qquad [D]$$

$$180^J[S, x] \text{ for } S_x \Leftrightarrow 2S_zI_z, \qquad [E]$$

and $$90^J[I, x] \text{ for } S_x \Leftrightarrow 2S_yI_y. \qquad [F]$$

In pulse sequences, the I and S labels and the x and y phases may be swapped at will. Thus, in a standard INEPT (Morris and Freeman, Journal of the American Chemical Society, 101, 760 (1979)) portion of a pulse sequence without refocusing pulses, $$90[S, x]-(2J)^{-1}-\{90[S, y]; 90[I]\}-(2J)^{-1}\ldots, \qquad [G]$$

$180^J[S, x]$ for $S_z+2S_xI_z$ may replace $90[S, x]-(2J)^{-1}$; [H]

$180^J[S, y]$ for $S_y+2S_zI_z$ may replace $(2J)^{-1}-90[S, y]$; [I]

$90^J[I, x]$ for $S_y2S_xI_y$ may replace $(2J)^{-1}-90[I]$; [J]

$180^J[I, x]$ for $2I_zS_z+I_x$ may replace $90[I]-(2J)^{-1}$; [K]

and, $90^J[S, y]$ for $2I_yS_x+I_x$ may replace $90[S, y]-(2J)^{-1}$. [L]

Also, $180^J$ as in scheme [H] can be used for the initial 90° excitation pulse in multiple quantum sequences (e.g. four-pulse HMQC as in Bendall, Pegg and Doddrell, Journal of Magnetic Resonance, 45, 8 (1981)), and a $90^J$ pulse can substitute for any of the subsequent 90° pulses. Furthermore, each transformation is frequency selective because the applied RF power is weak. Consequently, any combination of a $(2J)^{-1}$ free precession period and a consecutive 90° pulse, in any polarization transfer or multiple quantum pulse sequence, for an IS spin system, can be replaced by a frequency-selective $180^J$ or $90^J$ pulse.

Of the six 100% spinstate transformations listed in schemes [D] to [F], only the forward $S_z \rightleftharpoons 2S_xJ_z$ conversion has been described before (Brondeau and Canet, Journal of Magnetic Resonance, 47, 419 (1982)).

In all these substitutions of $180^J$ or $90^J$ pulses, assuming the pulses are of constant amplitude equal to J/2, the $(2J)^{-1}$ delay periods are increased in length by 40% to $2^{0.5}/(2J)$. Although this is a modest increase in time compared to the normal increase for pulses of similar frequency selectivity, further improvements are possible. In triple resonance sequences it is common to refocus the antiparallel state of spin S relative to spin P at the same time as creating the antiparallel state with respect to spin I, with the overall length of the free precession period determined by the smallest coupling constant. Accordingly, a $90^J$ pulse for the conversions, $S_x \rightleftharpoons 2S_yI$, where the IS coupling is larger than the PS coupling, can be substituted without increasing the length of the pulse sequence. This nesting option within a longer delay period, which is of particular value to NMR of large molecules, is not possible with $180^J$ pulses.

The analytical expression for the off-resonance selectivity of $180^J$ pulses are given by the $f_c^+ - f_c^-$ terms in matrix [64], and the corresponding expression for $90^J$ is the $-f_3$ term in matrix [67]. These expressions are plotted in FIG. 11 demonstrating that the selective properties of the $90^J$ pulse are superior to those of the $180^J$ pulse.

These ideal rectangular $90^J$ and $180^J$ pulses take the place of entire $(2J)^{-1}$ periods and are limited to selecting a single spectral bandwidth, of the order of J as displayed in FIG. 11. This selected region can be expanded by increasing the pulse amplitude to $B_1=bJ/2 (b\geq 1)$ decreasing the pulse length to $t_P$, and adding a delay $t_D$ before or after the pulse to complete the spinstate transformation. Thus $90^J[t_P]-t_D$ or $180^J[t_P]-t_D$ can replace $90-(2J)^{-1}$. Alternatively for the equivalent inverse transformations, $t_D-90^J[t_P]$ or $t_D-180^J[t_P]$ can replace $(2J)^{-1}-90$. The analytical expressions relating b, $t_P$, and $t_D$ are the same for both the $180^J$ and $90^J$ pulses. Applying matrix [65] for time $t_P$ and again for $t_D$ (or by using matrix [78] in the same way), yields these expressions for generalized $180^J$ and $90^J$ pulses as $$t_P = (a \cos[-1/b^2])/(\pi J(b^2+1)^{0.5}); \qquad [89]$$

$$t_D = (a \cos[1/b])/(\pi J). \qquad [90]$$

From matrix [64] the exact off-resonance selectivity of any general rectangular $180^J$ pulse is then given by $$0.5[(f_E^+ + f_E^-)(b^2-1)^{0.5} + (f_c^+ - f_c^-)]/b. \qquad [91]$$

Signal magnitude for a generalized $90^J$ pulse (from matrix [67]) follows a different equation to that for the $180^J$ transformations, and is given by $$0.5[f_9(b^2-1)^{0.5} + f_3]/b. \qquad [92]$$

Although these rectangular J pulses can be thus generalized to any bandwidth $\geq J$, the selectivity profiles given by expressions [91] and [92] show increased sinc wobbles off resonance compared to that for the ideal $90^J$ pulse in FIG. 11, similar to the the wobbles for the ideal $180^J$ pulse in FIG. 11, and so they would not be acceptable for present-day selective NMR.

These deleterious sinc wobbles can be reduced or eliminated by modulating or "shaping" the RF amplitude of J pulses. The calculation of the effect of amplitude modulation requires the repeated application of the appropriate rotation matrix, [64] or [67], for each rectangular pulse increment during the pulse shape (frequency modulation requires the input of phase for each increment as in matrix [66]). Computer simulations show that, at least for simple pulse shapes like gaussian or sinc, the length $t_P$ and the maximum $B_1$ amplitude, $RF_{max}$, can be found by iteration converging on 100% yield for a required spinstate transformation. This is true for any delay $t_D$ between zero and $(2J)^{-1}$ s thus proving, numerically, that any classical or non-classical spinstate transformation may be obtained with these RF shapes. The iterative search is assisted by starting with parameters for a rectangular pulse given by Eqs. [89] and [90], assuming the same average RF amplitude for the shaped and the rectangular pulse.

As an example of designing shaped J pulses, the offset profiles for the $S_x \rightleftharpoons 2S_yI_y$ transformation for a series of generalized half-gaussian $90^J$ pulses are shown in FIG. 12. FIG. 12c is the profile for a half-gaussian when there is no free precession period ($t_D=0$) for the spinstate conversion. This has a greater bandwidth than the ideal rectangular $90^J$ pulse (FIG. 12a) because of the higher maximum RF amplitude, $RF_{max}$. The RF amplitude modulation is given by $$B_1 = RF_{max} \exp[-a(t/t_p-1)^2], \qquad [93]$$

where a determines the truncation factor at the start of the pulse, set at the 1% level (log 0.01=−a) for FIG. 12c to 12g. Setting this factor to 100% returns the rectangular $90^J$ pulse as in FIG. 12a (identical to that shown in FIG. 11) and intermediate factors produce intermediate profiles as in FIG. 12b for which the truncation factor is set at 10% (a=−log 0.1). Increasing RF amplitude and reducing the pulse length as a fraction of $(2J)^{-1}$ produces a series of J pulses with increasing bandwidth as in FIG. 12d to 12g, where the conditions are: (d) $t_D=0.271J^{-1}$ s; $B_1=2.24J$ Hz; $t_P=0.275J^{-1}$ s; (e) $t_D=0.387J^{-1}$ s; $B_1=4.47J$ Hz; $t_P=0.136J^{-1}$ s; (f) $t_D=0.444J^{-1}$ s; $B_1=9.00J$ Hz; $t_P=0.0673J^{-1}$ s; (g) $t_D=0.473J^{-1}$ s; $B_1=18.5J$ Hz; $t_P=0.328J^{-1}$ s.

Alternatively, instead of reducing the length of a shaped J pulse to obtain a greater bandwidth, the nominal $t_D$ period for a simple shape such as half gaussian can be used for the application of an additional period of modulated RF to obtain a squarer selectivity profile. An example is provided in FIG. 13, where a half one-lobe sinc calibrated for $t_D=(4J)^{-1}$ has been replaced by a half three-lobe sinc for which $t_D=0$ yielding a selectivity profile with a flat top compared to FIG. 12c or 12d. For the profile in FIG. 13 it was found by iteration that the squareness of the profile could be improved by doubling the amplitude of the minor initial lobe with the conditions for the overall pulse given by $RF_{max}=1.8$ J and $t_P=0.58J^{-1}$.

DIPOLAR COUPLED SPIN SYSTEMS

The formalism presented in the foregoing QM theory also applies to dipolar coupling between heteronuclei. The J coupling considered so far results from the magnetic moment of the electronic shells associated with one spin interacting with the nuclear magnetic moment of another spin. In liquids, where relative spin orientations change rapidly, a spatial average is performed of the basic coupling interaction, resulting in a scalar value for J. In the weak-coupling limit (which always applies between heteronuclei), the term representing the scalar coupling in the Hamiltonian is $J*I_z*S_z$. Our discussion of the formalism and solutions for spin evolution has been given in the context of this interaction term.

Another important interaction is the dipolar coupling between the different nuclear magnetic moments. The spatial averaging caused by rapid tumbling of molecules in liquids gives zero for the dipolar interaction. In solids, the dipolar field is on the order of a Gauss, compared to $10^4$ Gauss magnetic fields used in modern high resolution NMR. In the high field approximation, combined with the weak coupling limit applicable to heteronuclear spin systems, the dipolar coupling term in the Hamiltonian is equal to $d*I_z*S_z$, where the dipolar coupling strength d is again a scalar. Hence, the formalism also applies to dipolar coupling between heteronuclei in strong magnetic fields.

In consequence, the analytical equations derived here can be applied to dipolar-coupled heteronuciei in solids and the same gains in efficiency of calculation will obtain.

While the invention has been particularly shown and described with reference to preferred embodiments thereof, it will be understood by those skilled in the art that the foregoing and other changes in form and details may be made therein without departing from the spirit and scope of the invention.

What is claimed is:

1. The method of exactly specifying a plurality of steps in a nuclear magnetic resonance pulse sequence in relation to a sample containing a coupled spin system comprising at least a first group and a second group of nuclear spins, said first group (I) comprising an integer number m of nuclei, said second group (S) comprising an integer number n of nuclei, said first group (I) being coupled to said second group (S), each one of said plurality of steps being a period of time comprising the application of radiofrequency energy of constant amplitude, phase and frequency, said pulse sequence comprising at least one first radiofrequency pulse applied to the S spins and at least one second radiofrequency pulse applied to the I spins, said method comprising:
   a) choosing a set of basis operators that in linear combination exactly represent the density operator of said coupled spin system;
   b) solving said density operator of said coupled spin system to obtain exact analytical solutions for the interconversion of said basis operators; and
   c) using at least two of said analytical solutions to calculate the magnitude of at least one of said basis operators at the termination of each of said plurality of steps.

2. A method according to claim 1 comprising setting the amplitude of the radiofrequency energy to zero for selected ones of said plurality of steps.

3. A method according to claim 1 comprising calculating the magnitudes of subsets of one, four, eight, ten, or fourteen of said basis operators for any of said plurality of steps.

4. A method according to claim 1 comprising applying steps a, b, and c to a portion of said pulse sequence.

5. A method according to claim 1 wherein said coupled spin system comprises at least three groups of nuclear spins, comprising calculating the magnitudes of said basis operators for each pair of said groups of nuclear spins for each of said plurality of steps.

6. A method according to claim 1 comprising calculation of effects of pulsed field gradients or nuclear spin relaxation on the magnitude of said basis operators.

7. A method according to claim 1 comprising determining the effects of a phase-cycled pulse in said pulse sequence by equating magnitudes of selected said basis operators to zero after the last said step of said phase-cycled pulse.

8. A method according to claim 1 further comprising forming the vector sum of the magnitudes of the said basis operators after each said time increment to produce the magnitudes and orientations of the individual measureable magnetization components of said I and S spins, said magnetizations being designated $I^{30}$, $I^-$, $S^+$, and $S^-$.

9. A method according to claim 8 comprising displaying said components, $I^+$, $I^-$, $S^+$, and $S^-$, as continuously rotating vectors in three-dimensional space.

10. The method of exactly specifying a plurality of steps in a nuclear magnetic resonance pulse sequence in relation to a sample containing a coupled spin system comprising at least a first group and a second group of nuclear spins, said first group (I) comprising an integer number m of nuclei, said second group (S) comprising an integer number n of nuclei, said first group (I) being coupled to said second group (S), each one of said plurality of steps being a period of time comprising the application of radiofrequency energy of constant amplitude, phase and frequency, said pulse sequence comprising at least one first radiofrequency pulse applied to the S spins and at least one second radiofrequency pulse applied to the I spins, said method comprising:
    a) choosing a set of basis operators that in linear combination exactly represent the density operator of said coupled spin system; and
    b) calculating the magnitude of four, eight, ten or fourteen of said basis operators at the termination of each of said plurality of steps.

11. A method according to claim 10 wherein calculating comprises solving said density operator of said coupled spin system numerically for the interconversion of said basis operators.

12. The method of operating a nuclear magnetic resonance spectrometer in relation to a sample containing a coupled spin system comprising at least a first group and a second group of nuclear spins, said first group (I) being coupled to said second group (S), said method comprising:
    a) applying a radiofrequency pulse to nuclei I, said radiofrequency pulse having a maximum amplitude of less than ten times the coupling between nuclei I and nuclei S;
    b) said radiofrequency pulse inducing the measurable magnetizations of nuclei I to rotate orthogonally relative to the field of said radiofrequency pulse; and
    c) allowing concurrent free precession of the measurable magnetizations of nuclei S in a plane transverse to the static magnetic field of said spectrometer.

13. The method according to claim 12 comprising rotating said magnetizations of nuclei I through ninety degrees.

14. The method according to claim 12 comprising discriminating between different resonance frequencies of I nuclei.

15. The method according to claim 12 comprising modulating the amplitude of said radiofrequency pulse during application of the said pulse.

16. The method of operating a nuclear magnetic resonance spectrometer in relation to a sample containing a coupled spin system comprising at least a first group and a second group of nuclear spins, said first group (I) being coupled to said second group (S), said method comprising:
  a) applying a first radiofrequency pulse to nuclei I;
  b) applying a second radiofrequency pulse to nuclei S;
  c) detecting the free induction decay radiofrequency signal from nuclei I concurrent with said second radiofrequency pulse;
  d) obtaining a spectrum of nuclei I by Fourier transforming said signal; and
  e) measuring the inhomogeneity of the radiofrequency field produced by said second radiofrequency pulse from the dispersion of the spectral sidebands adjacent to the centerband in said spectrum of nuclei I.

17. A method according to claim 16 comprising replacing said first radiofrequency pulse by any sequence of pulses on nuclei I and S.

18. A method according to claim 16 comprising applying a third radiofrequency pulse to nuclei S between said first radiofrequency pulse and said second radiofrequency pulse.

19. A method according to claim 18 comprising applying said third radiofrequency pulse having an amplitude of J/2 to nuclei S for a duration of $(2)^{0.5}/(2J)$ seconds wherein J is the coupling constant between nuclei I and S.

20. A method according to claim 19 comprising applying a fourth radiofrequency pulse to nuclei S between said second radiofrequency pulse and said third radiofrequency pulse.

21. A method according to claim 20 further comprising replacing said first radiofrequency pulse by any sequence of pulses on nuclei I and S.

22. A method according to claim 18 comprising replacing said first radiofrequency pulse by any sequence of pulses on nuclei I and S.

* * * * *